United States Patent
Servetto et al.

(10) Patent No.: US 6,516,297 B1
(45) Date of Patent: Feb. 4, 2003

(54) MULTIPLE DESCRIPTION LATTICE VECTOR QUANTIZATION

(75) Inventors: Sergio D. Servetto, Lusanne (CH); Neil J. A. Sloane, Highland Park, NJ (US); Vinay A. Vaishampayan, Summit, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/470,969

(22) Filed: Dec. 23, 1999

Related U.S. Application Data

(60) Provisional application No. 60/113,391, filed on Dec. 23, 1998.

(51) Int. Cl.$^7$ ............... G10L 19/12; H04N 7/12; G06K 9/38
(52) U.S. Cl. ............ 704/222; 704/222; 382/253; 375/240.22
(58) Field of Search ................ 704/222; 382/253; 375/260, 265, 280

(56) References Cited

U.S. PATENT DOCUMENTS

2001/0019591 A1 * 9/2001 Jafarkhani et al. .......... 375/265
2002/0034333 A1 * 3/2002 Vishwanath et al. ........ 382/253

OTHER PUBLICATIONS

Conway et al., "Fast Quantizing and Decoding Algorithms for Lattice Quantizers and Codes," Mar. 1982, IEEE Transactions on Information Theory, vol. IT–28, No. 2, pp. 227–232.*

Gersho et al., "Vector Quantization and Signal Compression," 1992, Kluwer Academic Publishers, pp. 335–338.*

Moriya, Takehiro, "Two–Channel Conjugate Vector Quantizer for Noisy Channel Speech Coding," Jun. 1992, IEEE Journal on Selected Areas in Communications, vol. 10, No. 5.*

Vaishampayan, V., "Vector Quantizer Design for Diversity Systems," Twenty–fifth Ann. Conf. Information Sci. Syst., Johns Hopkins University, Mar. 20–22, 1991, pp. 564–569.*

J. H. Conway, E. M. Rains and N. J. A. Sloane, "On The Existence of Similar Sublattices," Canadian Journal of Math, Jan. 2000, pp. 1–9 and references from the paper, pp. 36–38.

Vinay Anant Vaishampayan, "Design of Multiple Description Scalar Quantizers", IEEE Transactions on Information Theory, vol. 39, No. 3, pp. 821–834, (May 1993).

* cited by examiner

*Primary Examiner*—Marsha D. Banks-Harold
*Assistant Examiner*—V. Paul Harper
(74) *Attorney, Agent, or Firm*—Kenyon & Kenyon

(57) ABSTRACT

Data is transmitted using multiple description vector quantization by first quantizing the source vector at a lattice vector quantizer. After quantization, a labeling function is applied to the quantized source vector, creating a plurality of data streams. Each data stream is encoded and transmitted over a separate channel. Furthermore, the encoded data is decoded by first retrieving a representation of a sublattice point from a set of sublattice points from the data stream and then, determining a single data code word being associated with the retrieved representation of the sublattice point.

18 Claims, 16 Drawing Sheets

FIG. 10

| LATTICE POINT $\lambda$ | LABEL (UNDIRECTED) $e=\alpha_u(\lambda)$ | COLOR $c(e)$ | LABEL $\bar{e}=\alpha(\lambda)$ | LATTICE POINT $\lambda$ | LABEL (UNDIRECTED) $e=\alpha_u(\lambda)$ | COLOR $c(e)$ | LABEL $\bar{e}=\alpha(\lambda)$ |
|---|---|---|---|---|---|---|---|
| 0 | {0,0} | | (0,0) | | | | |
| a | {0,A} | 0 | (0,A) | d | {0,D} | 1 | (D,0) |
| b | {0,B} | 0 | (0,B) | e | {0,E} | 1 | (E,0) |
| c | {0,C} | 0 | (0,C) | f | {0,F} | 1 | (F,0) |
| g | {A,C} | 0 | (A,C) | j | {D,F} | 1 | (F,D) |
| h | {B,D} | 0 | (B,D) | k | {E,A} | 1 | (A,E) |
| l | {F,B} | 0 | (F,B) | i | {C,E} | 1 | (E,C) |
| n | {A,D} | 0 | (A,D) | q | {A,D} | 1 | (D,A) |
| o | {B,E} | 0 | (B,E) | r | {B,E} | 1 | (E,B) |
| p | {C,F} | 0 | (C,F) | m | {C,F} | 1 | (F,C) |
| x | {A,I} | 0 | (I,A) | ad | {D,L} | 1 | (D,L) |
| s | {D,G} | 0 | (G,D) | y | {A,J} | 1 | (A,J) |
| t | {E,G} | 0 | (G,E) | z | {B,J} | 1 | (B,J) |
| u | {E,H} | 0 | (H,E) | aa | {B,K} | 1 | (B,K) |
| v | {F,H} | 0 | (H,F) | ab | {C,K} | 1 | (C,K) |
| ac | {C,L} | 0 | (L,C) | w | {F,I} | 1 | (F,I) |

LATTICE POINTS  SUBLATTICE POINTS

MULTIPLE DESCRIPTION LATTICE VECTOR QUANTIZATION

PRIORITY

This application claims the benefit of U.S. Provisional Patent Application Serial No. 60/113,391 entitled "Multiple Description Lattice Vector Quantization" and filed Dec. 23, 1998.

FIELD OF THE INVENTION

The present invention relates to transmitting data over a network. In particular, the present invention relates to systems and methods for transmitting data using multiple description vector quantization.

BACKGROUND

Many ways are known for transmitting different types of data over a network. For example, FIG. 1 displays a block diagram of a system that can transmit audio or video data. In this configuration, source 101 provides some form of analog data. That data is then converted to a digital stream, or quantized, at analog-to-digital converter (ADC) 102. Once the data is quantized, it can be easily encoded by encoder 103, and transmitted to receiver 105 over network 104. Receiver 105 passes the data to decoder 106, which decodes the data, thereby substantially recreating the original data stream. If the data is audio, for example, decoder 106 typically will recreate the data with some level of accuracy so the data can be played and recognized in an acceptable fashion. This configuration is called a "single description" system because only a single stream of data is transmitted from the source to the receiver.

If, however, part of the data-stream transmission is disrupted during its transmission from the source to the receiver, acceptable reconstruction at the receiver may not be possible. To minimize disruptions during transmission, "multiple description" systems can be used. In a multiple-description scheme, an encoder generates multiple streams of data. Each data stream in the multiple streams of data can individually reproduce the original data in an acceptable form. If the decoder receives all the data streams, the original data can be reconstructed very accurately. On the other hand, if only one data stream is received, and reconstructed to $X^1_n{}'$, the reconstructed data, and hence the playback, will not be as high quality as the complete reconstruction, but will be acceptable, at least over a short time scale. In general, receiving all the data streams gives optimal reconstruction, but over short periods of time, if one data stream is missing, that missing data stream can be dropped from the reconstruction without serious diminution of the quality of the reconstructed data.

FIG. 2 is a block diagram of the components of a multiple-description system. In this system, source 201 again provides analog data, and this data is quantized at ADC 202. After quantization, the digital data is encoded for transmission at encoder 203. Encoder 203, in a multiple-description scheme, encodes the data into multiple streams for transmission. In FIG. 2, only two streams are shown for simplicity, and only two streams are discussed for simplicity; in principle, however, an arbitrary number of encoded streams can be created and used.

Once the two streams are encoded, they are independently transmitted over network 204 to receiver 205. Receiver 205 contains, in this example, three decoders, 205a, 205b and 205c. If both streams are received at decoder 205a, the two streams are recombined into an effective reconstruction of the data. If, however, only one of the streams arrives at receiver 205, decoder 205b or 205c can decode the data into an acceptable reconstruction of the original data. This reconstruction will typically be of lesser quality than if the two streams are received and combined at decoder 205a. In general, if parts of one transmitted stream are dropped, then those parts of the transmission will be recreated using the single stream that arrives at the receiver, and the rest of the transmission will be recreated using the two combined streams that are received at decoder 205a. A decoded single stream will then be played back to a viewer or listener, for example, at the appropriate time during playback, while the recombined double stream will played at all other times.

Known systems use a type of multiple-description coding called "layer" or "hierarchical" coding. In these schemes, an encoder generates two or more streams of bits of varying importance. For example, if two streams are generated, one stream is considered more important than the other stream. This scheme gives the network flexibility to drop bits if, for example, the network is congested. If the network is congested, the network can choose to drop the less-important bits. In this scheme, the network guarantees that it always is going to deliver the most important stream of bits. Thus, users are assured a certain basic quality in the reconstructed video or audio data. If a user, on the other hand, can receive more streams of data, the playback will be of higher quality.

Two general schemes exist for multiple-description coding. One scheme, called scalar quantization, quantizes the source data by assigning a single data number to each sample of the source data. This scalar quantization can be visualized with reference to FIG. 3. FIG. 3 is a representation of scalar quantization in which the horizontal axis represents charge, and the vertical axis represents discrete binary numbers that are assigned to a received charge. With scalar quantization, the input is a scalar, or one-dimensional, quantity. If input voltage is known to lie in a certain range, and only 8 bits are used for quantization, the voltage range is divided up by partitioning the input-voltage range into a series of sub-ranges, and a distinct binary number is assigned to each sub-range.

Another form of quantization, called vector quantization, quantizes the source data by applying a single data number to a fixed plurality of samples of the source data. With vector quantization, voltage input is generalized into multiple dimensions. Thus the charge input has indices, $x=(x_n, x_{n+1} \ldots x_{n+m})$. x is a charge input that is sampled, for example, at multiple times. Thus, for example, $x_n$ might be a charge at time=n, and $x_{+1}$ would be the charge at time=n+1.

Vector quantization can be visualized with reference to FIG. 4. FIG. 4 is a two-dimensional graph in which the vertical and horizontal axes each represent charge sampled in some way from analog data. Each two-dimensional area in the represented plane is assigned a unique data number, thereby encoding the vector represented by every point in the plane. Using the example above, the horizontal axis can represent speech data sampled at time $x_n$, and the vertical axis can represent data sampled at time $x_{n+1}$. Note that a two-dimensional plane is used merely for simplicity of representation. A quantized vector can contain an arbitrary number of sampled points.

An achievable rate region for the multiple description problem was first given by El Gamal and Cover in their article titled "Achievable rates for multiple descriptions," *IEEE Trans. Inform. Th.*, vol. IT-28, November 1982, and Ozarow has shown that this region coincides with the rate distortion region for a memoryless Gaussian source and the squared-error distortion. See L. Ozarow, "On a source coding problem with two channels and three receivers." *The Bell Syst. Tech. J.*, vol. 59, December 1980. Both articles are incorporated herein by reference. The problem of multiple description quantizer design, including a formulation and solution of the underlying labeling problem in one dimension was presented in a paper by V. A. Vaishampayan, titled "Design of multiple description scalar quantizers," *IEEE Trans. Inform. Theory*, vol. 39, pp. 821–34, May 1993, incorporated herein by reference. An asymptotic performance analysis of this quantizer was presented in J. C. Battlo and V. A. Vaishampayan, "Multiple-description transform codes with an application to packetized speech," in *Proceedings of the* 1994 *IEEE International Symposium on Information Theory*, Trondhaim, Norway, June 1994 incorporated herein by reference.

Lattice quantizers (for the single description problem) have been extensively studied. Zador, in his paper titled "Asymptotic quantization error of continuous signals and the quantization dimension," *IEEE Trans. Inform. Th.*, vol. IT-28, pp. 139–49, March 1982, incorporated herein by reference, used a random quantization argument to give upper and lower bounds on the performance of quantizers for a fixed dimension. Detailed descriptions of the Voronoi regions of specific lattices are given by Conway and Sloane in *Sphere Packings, Lattices and Groups*. New York: Springer-Verlag, 1988, incorporated herein by reference, and their second moments are evaluated. Fast quantizing algorithms for lattice quantizers are given in J. H. Conway and N. J. A. Sloane, "Fast quantizing and decoding algorithms for lattice quantizers and codes," *IEEE Trans. Inform. Th.*, vol. 28, pp. 227–32, March 1982, incorporated herein by reference. Gersho, in "Asymptotically optimal block quantization," *IEEE Trans. Inform. Th.*, vol. IT-25, pp. 373–80, July 1979, incorporated herein by reference, conjectured that for rth power difference distortion measures, any optimal quantizer, in any dimension, has Voronoi regions that are congruent to some polytope.

For multiple-description, hierarchical coding, it does not matter whether the quantization is scalar or vector. What matters is simply that more than one data stream is produced, and each data stream is given a certain relative importance with respect to the other data streams. Many networks, however, cannot guarantee that the most important bits are going to reach their destination. For example, the Internet cannot make any such guarantee. In these cases, the layered approaches do not work very well, because if the most important bits in a data stream are lost, the data may not be reconstructable in a usable form. Thus, a need exists for a multiple-description scheme that does not rely on a hierarchy of data schemes, and so does not rely on a guarantee by the network to deliver the most important data stream.

SUMMARY OF THE INVENTION

To alleviate the problems inherent in known systems, the present invention introduces systems and methods for coding and transmitting data using multiple description lattice vector quantization with lattice codebooks. In one embodiment of the present invention, a source vector is quantized at a lattice vector quantizer. A labeling function is then applied to the quantized source vector, thereby creating at least a first data stream and a second data stream. The first and second data streams are then encoded and transmitted.

To apply the labeling function, in one embodiment of the present invention, the quantized source vector is associated with at least a first sublattice point associated with a first data code word and a second sublattice point associated with a second data code word. The first data code word is then transmitted in the first data stream, and the second data code word is transmitted in the second data stream.

At the receiving end of the transmission, if all data streams are received intact, they are recombined by a decoder, and prepared for playback. If one or more data stream, however, contains gaps when received, the remaining data stream or streams are combined and played back without those missing portions of the incomplete data stream.

BRIEF DESCRIPTION OF THE DRAWINGS

FIG. 10 displays an example of the results of matching lattice points with edges.

DETAILED DESCRIPTION

The present invention involves systems and methods for multiple description lattice vector quantization. In particular, the present invention involves systems and methods for constructing, transmitting and decoding a plurality of data streams that represent, either individually or in combination, an original data source. To perform these tasks, a vector quantizer is used to determine a certain sublattice vector that is nearest to a lattice point. Once this sublattice vector is known, a number of data streams are constructed. Each data stream can be used individually, or in combination with the other data streams, to recreate the original lattice vector, and thus the original data represented by the lattice vector.

Figure 1:
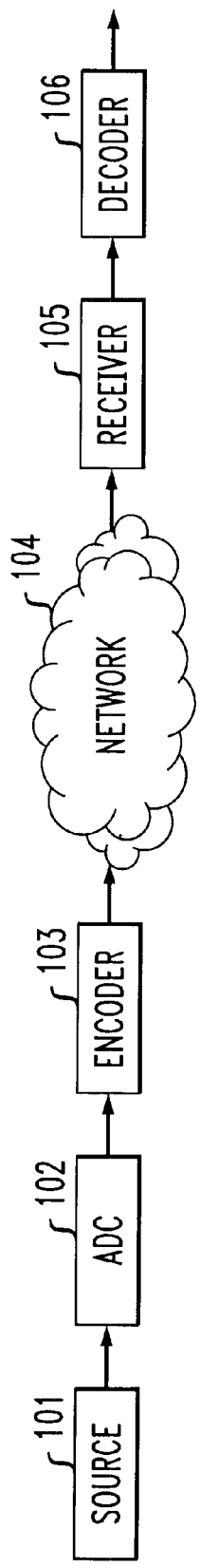
FIG. 1 is a block diagram of a single-description encoding and transmitting scheme, containing a source, and encoder, a network and a decoder.
Figure 2:
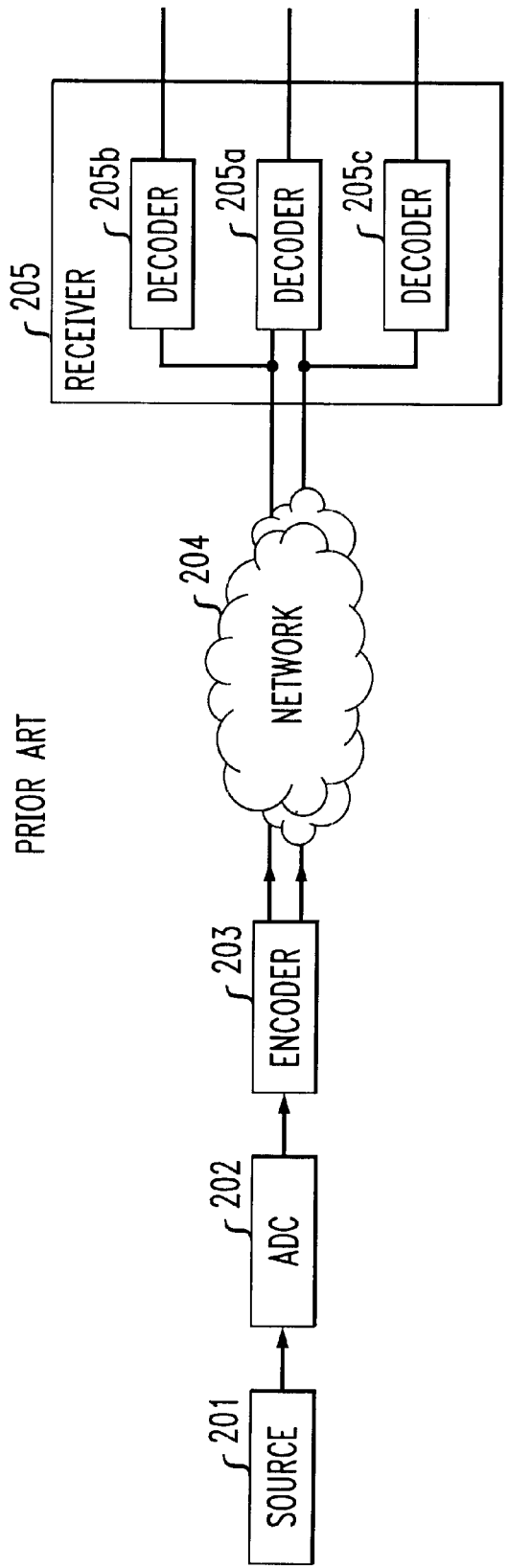
FIG. 2 is a block diagram of a multiple-description encoding and transmitting scheme, containing a source, an encoder, a network, and a decoder.
Figure 3:
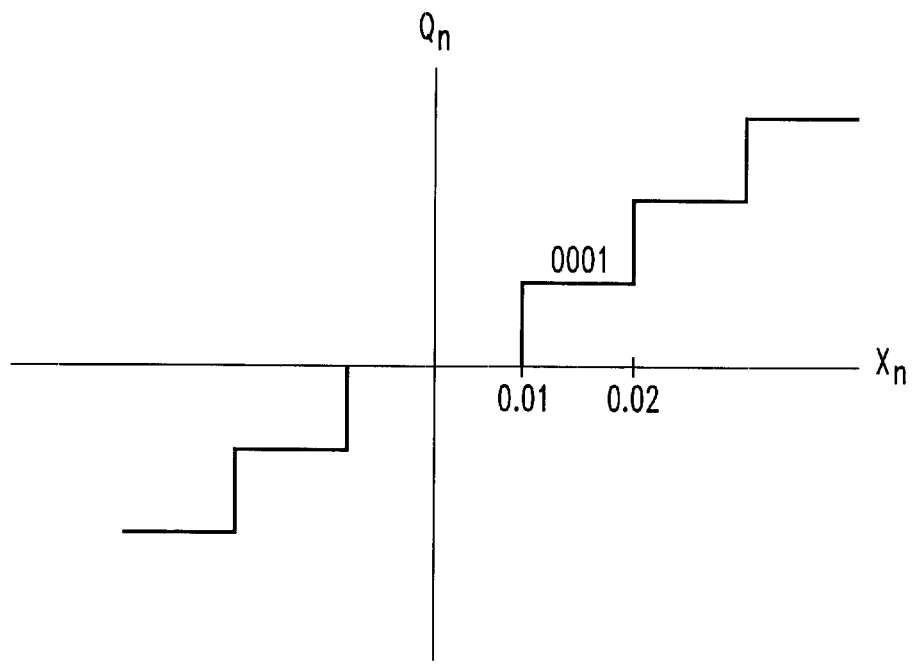
FIG. 3 is a representation of scalar quantization in which the horizontal axis represents charge, and the vertical axis represents discrete data numbers that are applied to the received charge.
Figure 4:
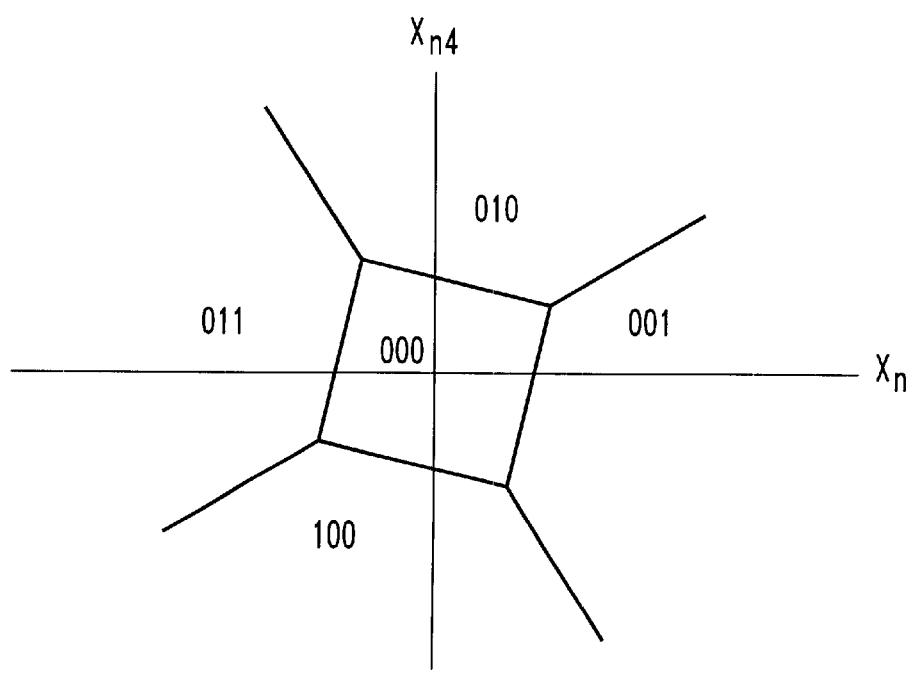
FIG. 4 is a two-dimensional representation of vector quantization in which the vertical and horizontal axes each represent charge sampled in some way from analog data.
Figure 5:
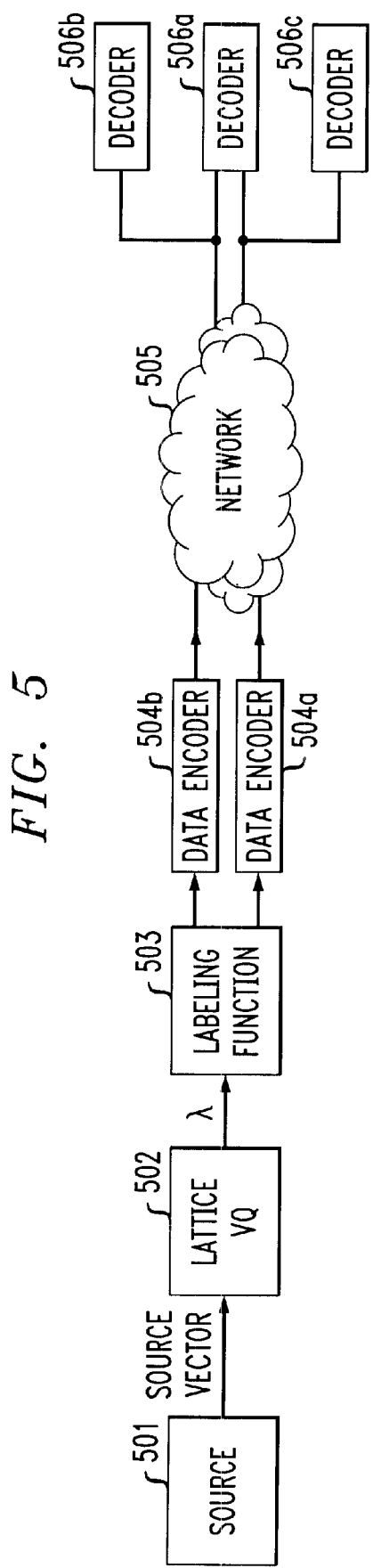
FIG. 5 is a block diagram of a system overview of a multiple description lattice vector quantizer.

FIG. 5 is a block diagram of a system overview of a multiple description lattice vector quantizer. For the purposes of simplicity of discussion, a two-dimensional vector space is used here. In general, however, embodiments of the invention can use source vectors and lattice vector quantizers of arbitrary dimension.

In the embodiment shown in FIG. 5, source 501 provides a source vector to lattice vector quantizer 502. Lattice vector quantizer 502 quantizes the source vector, and then labeling function 503 creates two data streams and provides them to data encoders 504a and 504b. Again, two data streams, and two encoders, are shown for simplicity of discussion only. The embodiments of the invention can be generalized to an arbitrary number of data streams, each corresponding to an entry in the quantized source vector.

Data encoders 504a and 504b transmit the two data streams over network 505, and they are received, in whole or in part, by decoders 506a, 506b and 506c. The decoders then decode the received data streams to give, typically, the best reproduction they can by combining all the received data in the appropriate way.

The two-dimensional source vector received at lattice vector quantizer 502 is defined as two samples of some signal. The lattice vector quantizer contains a lattice code book. This lattice code book contains points λ that belong to the lattice Λ. That is, λ is a lattice vector, and Λ is a collection of lattice vectors.

Figure 6:
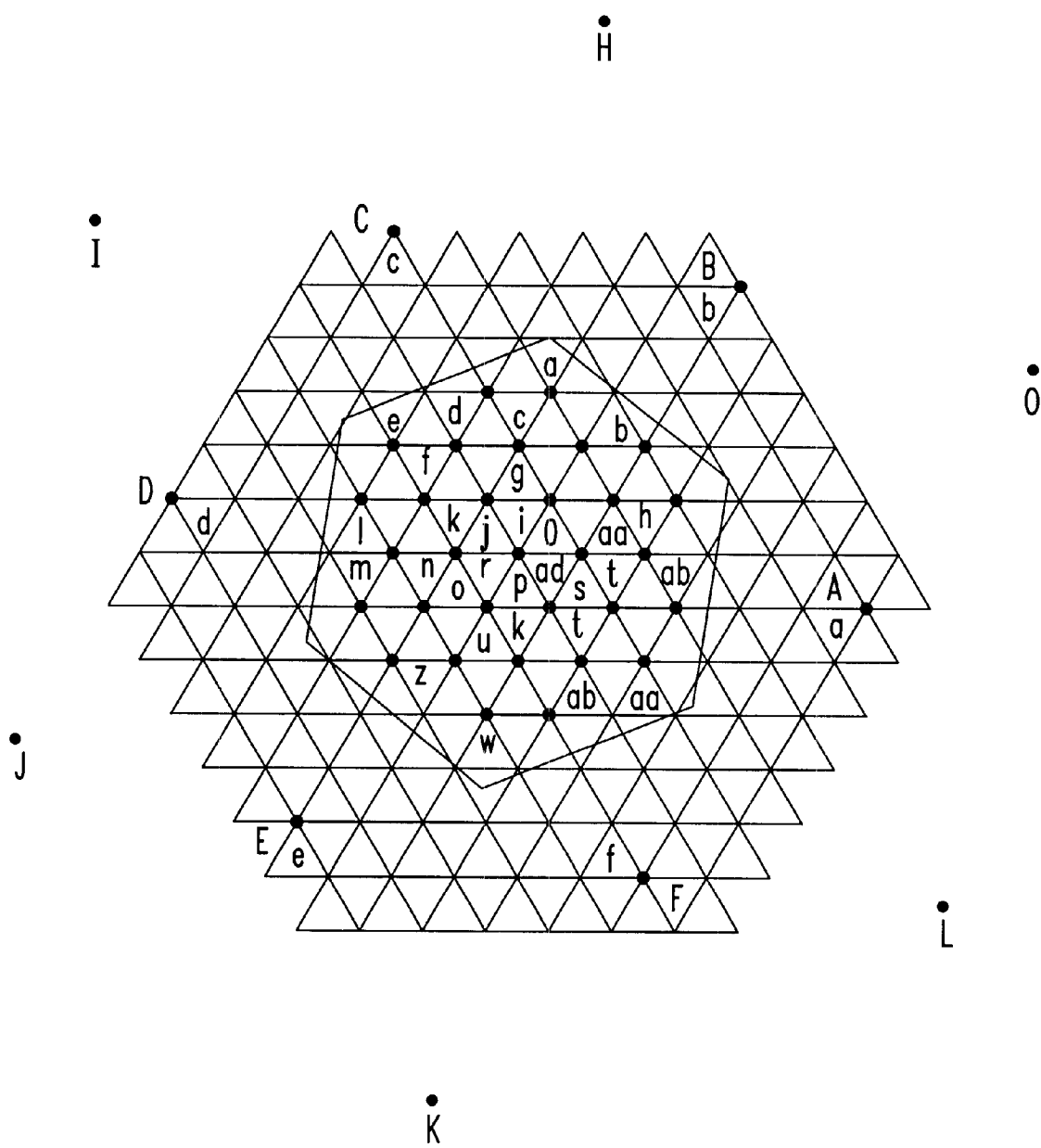
FIG. 6 is an example of a portion of a two-dimensional hexagonal lattice used to visualize a lattice $\Lambda$.

FIG. 6 is an example of a two-dimensional hexagonal lattice used to visualize a lattice Λ. Each "dot," or point in the lattice is an element of the lattice code book. The lattice vector quantizer determines which element of the lattice codebook is closest to the source vector. This lattice vector is referred to as the quantized source vector, or simply as the quantized vector.

Once the source vector is quantized, it is sent to a labeling function. The labeling function, in the exemplary lattice shown in FIG. 6, must construct two data streams. Each individual data stream in this embodiment of the present invention should have enough information to be able to reasonably and reliably reconstruct the original data at a receiver. Additionally, if both data streams are received and recombined at decoder 606, the recombined data streams should be of higher quality than each original constituent data stream.

Figure 7:
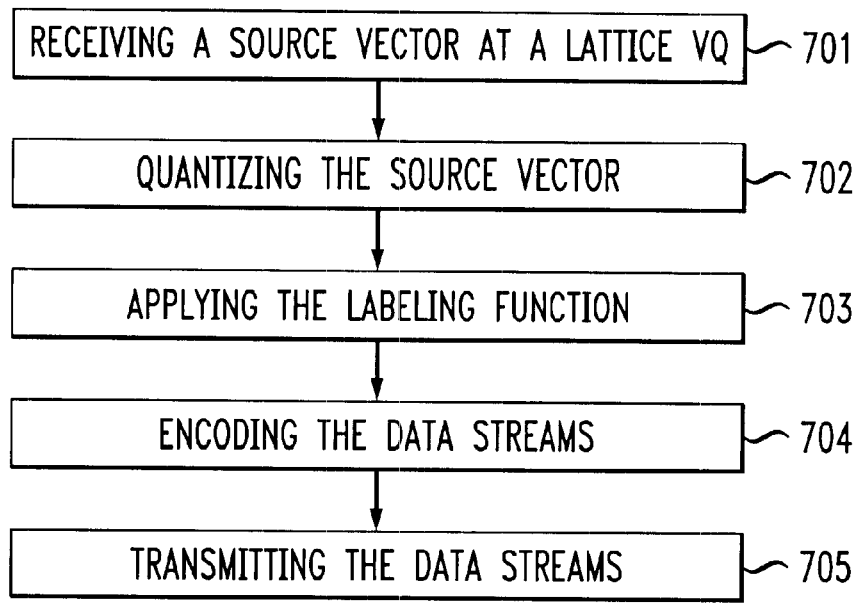
FIG. 7 is a flow chart of a method embodiment of the present invention detailing how a multiple description lattice vector quantizer is used.

FIG. 7 is a flow chart of a method embodiment of the present invention detailing how a multiple description lattice vector quantizer is used. One skilled in the art should appreciate that the order of the flow chart, like the order of steps in the claims, is not mandatory, and the invention should not be limited to the recited order. Rather, the invention as described and claimed can be practiced in any order that is practicable.

At step 701, a source vector is received at a lattice vector quantizer. The source vector can represent any kind of data stream. At step 702, the lattice vector quantizer quantizes the source vector. For example, the lattice vector quantizer can use, as a lattice, a two-dimensional hexagonal lattice similar to the lattice displayed in FIG. 6. In general, the source vector and lattice are not limited to two dimensions. Rather, they can be of arbitrary dimensionality.

At step 703, a labeling function is applied to the quantized source vector. This labeling function creates a number of data streams, each data stream corresponding to an entry in the source vector. In one embodiment of the present invention, applying the labeling function means that the quantized source vector is associated with at least a first sublattice point that is itself associated with a first data code word, and with a second sublattice point that is itself associated with a second data code word. One skilled in the art should appreciate that the data code word can take any digital form, such as a binary code word, a hexadecimal code word, or any analogous form.

In step 704, these data streams are then encoded, and at step 705, the encoded data streams transmitted as distinct data streams. One skilled in the art should appreciate that all flow charts presented herein, and all claims presented herein, are not limited to the order in which the steps are presented. Rather, the various embodiments can be practiced in any order practicable.

Figure 8:
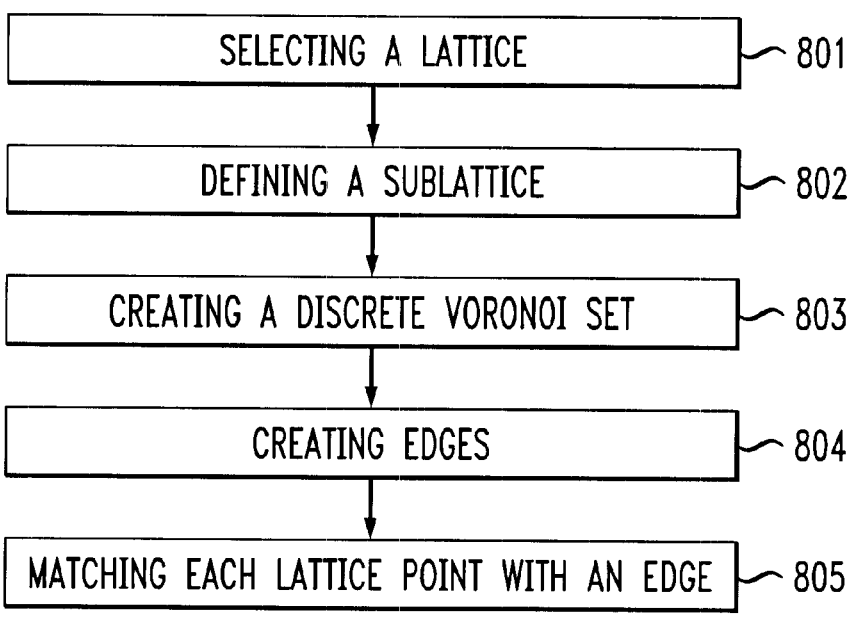
FIG. 8 provides a flow chart for making a labeling function according to one embodiment of the present invention.

FIG. 8 provides a flow chart for making a labeling function according to one embodiment of the present invention. At step 801, a lattice is selected to be used as the lattice vector quantizer. At step 802, a sublattice is selected by some combination of scaling and rotating the lattice received in step 801. The sublattice is of a "coarser" scale than the original lattice. In other words, the sublattice contains fewer points per unit volume than the original lattice in the lattice vector quantizer. In an embodiment in which the sublattice is a scaled version of the lattice, the sublattice is defined by some index N that is the number of fine lattice points per coarse lattice point. So, for example, in FIG. 6, 31 lattice points are associated with each sublattice point. Thus, the sublattice is 31 times "coarser" than the lattice, and so the index N is 31.

Once this sublattice is created, then at step 803, a discrete Voronoi set of lattice points for a given sublattice point is created. The given sublattice point can be called the origin, to distinguish it from the other sublattice points. Thus, for a given sublattice point, or origin, all the lattice points that are closer to that origin than to any other sublattice point are computed.

At step 804, a plurality of sublattice points are matched to a given sublattice point such that, for a lattice and a Voronoi set with N lattice points, N sets of sublattice points exist, each set containing two sublattice points. Each set of sublattice points is called an edge. Edges represent pairs of sublattice points.

Once the edges are created (i.e., once all the pairs of sublattice points are known), at step 805 each lattice point in the discrete Voronoi set is matched with a distinct edge.

Figure 9:
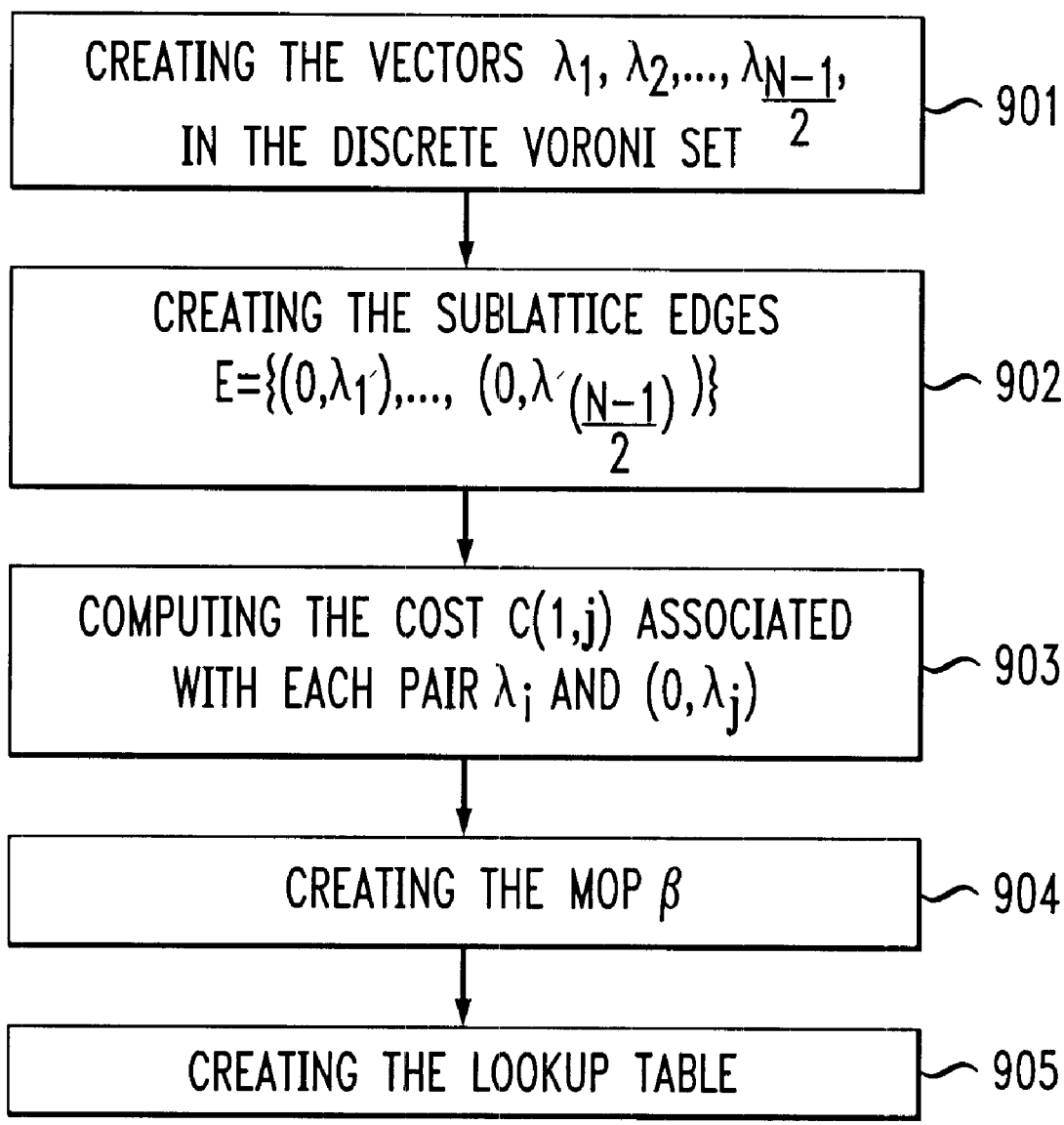
FIG. 9 is a flow chart that describes the steps of creating edges.

FIG. 9 is a more detailed flow chart that explains the steps in FIG. 8 more precisely.

At step 901, the discrete Voroni set around the origin is created, i.e., all the lattice vectors $\lambda$ that are closer to the origin than to any other sublattice point. This set is reduced to $(N-1)/2$ vectors by omitting the zero vector and by keeping only one vector $\lambda_a$ out of each pair $\lambda_a$ and $-\lambda_a$. This is done in any arbitrary manner. The vectors in this set are listed as $\{\lambda_1, \lambda_2, \ldots \lambda_{(N-1)/2}\}$. Step 901 is a more detailed version of step 803.

At step 902, the N shortest sublattice vectors of the form $(0, \lambda')$ are created, i.e., the edges $\{0, \lambda'_1), (0, \lambda'_2), \ldots, (0, \lambda'_N)\}$ are created, where $\lambda'_1, \ldots, \lambda'_N$ are the N sublattice vectors that are closest to the origin. This set is reduced to $(N-1)/2$ edges by deleting the edge $(0,0)$ and by keeping only one edge out of each part $(0,\lambda')$ and $(0,-\lambda')$. This choice can be made in any arbitrary manner. The resulting set is $$\epsilon = \{(0,\lambda'_1), (0,\lambda'_2), \ldots, (0,\lambda'_{(N-1)/2})\}.$$

Step 902 is a more detailed version of step 804.

At step 903, the cost $c(i,j) = _{\lambda' \in \Lambda'}{}^{min}\{\|\lambda_i - \lambda^1\|^2 + \|\lambda_i - (\lambda'_j - \lambda')\|^2\}$ is computed for each lattice point $\lambda_i$ from step 901 and each edge $(0, \lambda'_j)$ from step 902. $\alpha(i,j)$ denotes the sublattice shift $\lambda'$ that achieves this minimum.

At step 904, a one-to-one mapping $\beta$ is created which maps the integers $\{1, 2, \ldots, (N-1)/2\}$ to the integers $\{1, 2, \ldots, (N-1)/2\}$ and which minimizes the sum $$\sum_i c(i, \beta(i)).$$

This step can be performed by one of several standard mathematical methods. Step 904 is a more detailed version of step 805.

At step 905, a lookup table is created as follows. The first row of the first column is zero. The 2nd, 3rd, . . .

$$\left(\frac{N-1}{2}\right) + 1^{th}$$

rows of the 1st column are $\lambda_1, \lambda_2, \ldots$ $$\lambda\frac{N-1}{2}.$$

The $$\left(\frac{N-1}{2}\right) + 2^{th}$$

through $N^{th}$ rows of the 1st column are $-\lambda_1, -\lambda_2, \ldots$ $$\lambda\frac{N-1}{2}.$$

The first row of the second column is the edge $\{0,0\}$. The 2nd, 3rd, . . .

$$\left(\frac{N-1}{2}\right) + 1^{th}$$

rows of the second column are the edges $\{-\alpha(i,\beta(i)), \lambda'_{\beta(i)} - \alpha(i,\beta(i))\}$, i=1, 2, . . . , $$\left(\frac{N-1}{2}\right).$$

The $$\left(\frac{N-1}{2}\right) + 2, \ldots N^{th}$$

rows are the edges $\{\alpha(i,\beta(i)), -\lambda'_{\beta(i)} + \alpha(i,\beta(i))\}$, i=1, 2, . . . , $$\left(\frac{N-1}{2}\right),$$

respectively.

FIG. 10 displays an example of this lookup table. Column 10a contains all the lattice points in the discrete Voronoi set of lattice points. Column 10b displays all the edges as they are matched to each lattice point.

Figure 11:
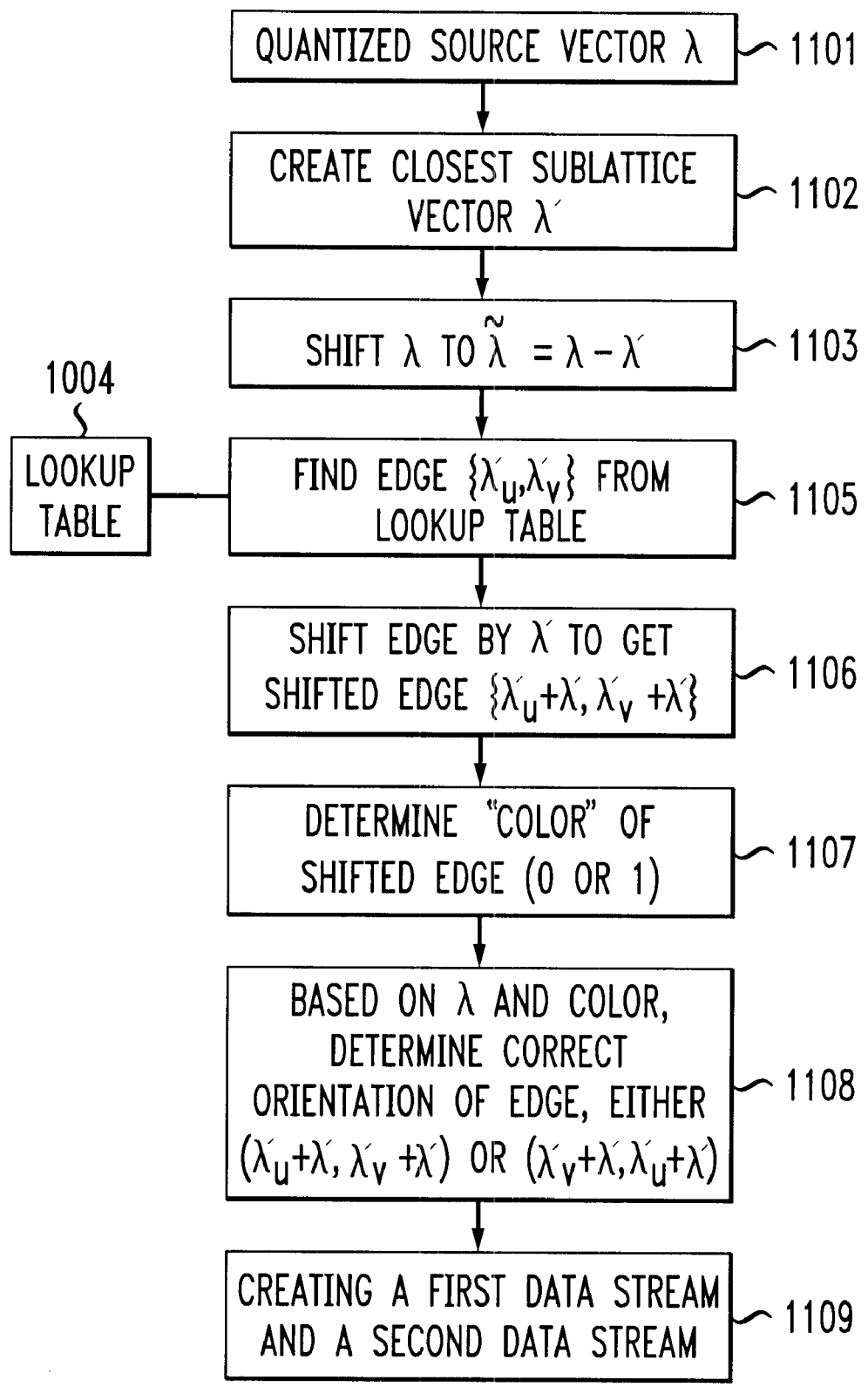
FIG. 11 is a flow chart of how edges are used according to an embodiment of the present invention.

FIG. 11 is a flow chart of how the labels are computed when the multiple description quantizer is being used according to an embodiment of the present invention. At Step 1101, a quantized source vector $\lambda$ is inputted.

At Step 1102, the closest sublattice vector $\lambda'$ to $\lambda$ is determined. To those skilled in the art this is a routine procedure based on a decoder for the sublattice.

At Step 1103 the shifted source vector $\lambda = \lambda - \lambda'$ is calculated.

At Step 1104, the lookup table from Step 905, here denoted by 1105, is used to find the edge $\{\lambda'_u, \lambda'_v\}$ corresponding to $\lambda$.

At Step 1106, the edge is shifted by $\lambda'$ to get $\{\lambda'_u + \lambda', \lambda'_v + \lambda'\}$.

At Step 1007, the "color" of the edge is determined by (21) below.

At Step 1108, based on $\lambda$ and the color of the edge, the correct orientation of the edge, i.e. either $(\lambda'_u + \lambda', \lambda'_v + \lambda')$ $(\lambda'_v + \lambda', \lambda'_u + \lambda')$ is determined, using (22) and (23) below.

At Step 1109, the first component of the oriented edge (either $\lambda'_u + \lambda'$ or $\lambda'_v + \lambda'$) is sent to the first data stream, and the second component (either $\lambda'_v + \lambda'$ or $\lambda'_u + \lambda'$) is sent to the second data stream. The purpose of Step 1108 is to ensure that the quality of transmission of each data stream is balanced between the two streams.

Figure 12:
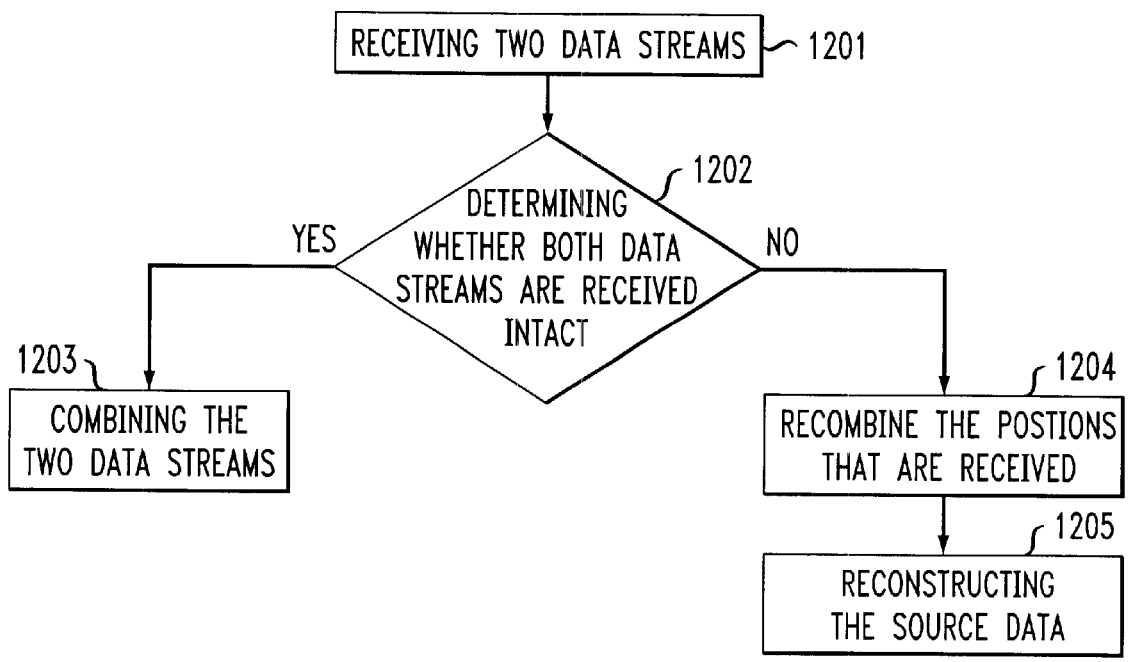
FIG. 12 is a flow chart that displays steps used, in one embodiment of the present invention, for decoding the signal.

FIG. 12 is a flow chart that displays steps used, in one embodiment of the present invention, for decoding the signal. At step 1201, the two separate data streams are received at a decoder. At step 1202, the decoder determines whether both the data streams are received intact. If both the data streams are received intact, then at step 1203, the two data streams are recombined to give a facsimile of the original message. In one embodiment of the present invention, the decoder, at step 1203a, looks up in a table what single data word the two points represent, and then, at step 1203b, reconstructs the original point, and thus the original data value associated with that piece of data.

If one of the data streams is not received intact, then at step 1204, the decoder recombines the portions of the message that are received. At step 1205, the source data is reconstructed using the recombined data where it is available, and non-recombined data where recombined data is not available.

To determine whether both data streams are received intact, in one embodiment of the present invention, the decoder uses an index in each received packet, matching like-indexed packets from each data stream. A single data code word that represents a pair of combined packets is retrieved for decoding and is used to reconstruct the data. If a portion of one of the data streams is not received, that portion of the other data stream is decoded and is used to reconstruct the data.

Figure 13:
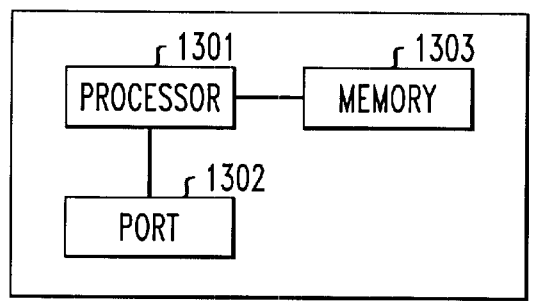
FIG. 13 is a block diagram of an apparatus embodiment of the present invention.

FIG. 13 is a block diagram of an apparatus according to an embodiment of the present invention. Processor 1301 is coupled to port 1302 and memory 1303. Port 1302 can be used to send and receive data. Memory 1303 stores instructions adapted to be executed by processor 1301 to perform any method embodiment of the present invention. For example, memory 1303 can store instructions adapted to be executed by processor 1301 to quantize a source vector, apply a labeling function to the quantized source vector, thereby creating a first and second stream of data, and then encoding both streams of data.

For the purposes of the present invention, memory includes any medium capable of storing instructions adapted to be executed by a processor. Some examples of such media include, but are not limited to, floppy disks, CDROM, magnetic tape, and hard drives. As used herein, the phrase "adapted to be executed by a processor" is meant to encompass instructions stored in a compressed and/or encrypted format, as well as instructions that have to be compiled or installed by an installer before being executed by the processor.

The present invention also encompasses embodiments of a computer-readable medium (independent of a processor or port) that stores instructions adapted to be executed by a processor to perform embodiments of the method of the present invention. Examples of such a computer readable medium include the examples of memory discussed above.

The discussion below formalizes the concepts expressed above.

The problem of designing a multiple description vector quantizer with lattice codebook $\Lambda$ is considered. A solution to a certain labeling problem is shown below to be an important step in the design of such quantizers. This labeling problem is solved in the general case. Numerical performance results are obtained for the lattices $A_2$ and $Z^i$, where i=1, 2, 4, 8.

The high-rate squared-error distortions of this vector quantizer are then analyzed for a memoryless source with probability density function p and differential entropy h(p) <∞. For any $\alpha \in (0,1)$ and rate pair (R,R), it is shown that the two-channel distortion $\bar{d}_0$ and the channel 1 (or channel 2) distortion $\bar{d}_s$ satisfy $$\lim_{R\to\infty} \bar{d}_0 2^{2R(1-a)} = G(\Lambda)2^{2h(p)}/4$$

and $$\lim_{R\to\infty} \bar{d}_s 2^{2R(1-a)} = G(S_L)2^{2h(p)}$$

where $G(\Lambda)$ is the normalized second moment of a Voronoi cell of the lattice $\Lambda$ and $G(S_l)$ is the normalized second moment of a sphere in L dimensions.

The problem of designing a multiple description vector quantizer is considered for a memoryless source with probability density function p, differential entropy h(p)<∞ and the squared-error distortion measure. A multiple description vector quantizer encodes vectors for transmission over a two-channel communication system. The objective is to send information about the source vector over each channel in such a way that good performance is obtained when both channels work, and the degradation is small when either channel fails. It is assumed for the discussion below that the encoder has no knowledge about the state of a channel, i.e., it does not know whether a channel has failed or is working.

For the single-description problem, one of the benefits of vector quantization over scalar quantization is a reduction in granular distortion. This is because in higher dimensions it is possible to construct Voronoi cells that are more "spherical" than the hypercube. To be more specific, uniform scalar quantization coupled with entropy coding is known to have mean squared error (mse) $\bar{d}(R)$ at entropy R bits/sample satisfying $$\lim_{R\to\infty} \bar{d}(R)2^{2R} = \frac{2^{2h(p)}}{12}; \tag{1}$$

whereas if an L-dimensional lattice $\Lambda$ is used as a codebook, the distortion satisfies $$\lim_{R\to\infty} \bar{d}_{RD}(R)2^{2R} = G(\Lambda)2^{2h(p)}, \tag{2}$$

where $G(\Lambda)$ is the normalized second moment of a Voronoi cell of the lattice. In dimensions larger than one, lattices exist for which $G(\Lambda)$ is strictly smaller than 1/12. For example, in 8 dimensions, it is possible to gain 0.66 dB by using the lattice $E_8$ as compared to uniform scalar quantization. By a random quantizing argument, quantizers exist whose asymptotic (in rate) performance goes to $2^{2h(p)}/(2\pi e)$. The maximum gain possible over entropy-coded scalar quantization is 1.53 dB and lattices provide a useful method for closing this gap.

Consider a multiple description quantizer that sends information across each channel at a rate of R bits/sample. The performance of this system is measured in terms of three distortions: the two-channel distortion $\bar{d}_0$, when both descriptions are available to the decoder; the channel-1 distortion $\bar{d}_1$, when only the first description is available, and the channel-2 distortion, $\bar{d}_2$, when only the second description is available. It is conventionally assumed that $\bar{d}_1=\bar{d}_2=\bar{d}_s$, and this common value is referred to as the side distortion. The objective is to design vector quantizers that minimize $\bar{d}_0$ under the constraint $\bar{d}_s \leq D_s$, for a given rate pair (R,R).

For a uniform entropy-coded multiple description quantizer, and any $\alpha \in (0,1)$ the distortions satisfy $$\lim_{R\to\infty} \bar{d}_0(R)2^{2R(1+a)} = \frac{1}{4}\left(\frac{2^{2h(p)}}{12}\right), \tag{3}$$

$$\lim_{R\to\infty} \bar{d}_s(R)2^{2R(1-a)} = \left(\frac{2^{2h(p)}}{12}\right).$$

On the other hand, using a random quantizer argument, by encoding vectors of infinite block length, it is possible to achieve distortions $$\lim_{R \to \infty} \overline{d}_0(R) 2^{2R(1+a)} = \frac{1}{4}\left(\frac{2^{2h(p)}}{2\pi e}\right), \quad (4)$$

$$\lim_{R \to \infty} \overline{d}_s(R) 2^{2R(1-a)} = \left(\frac{2^{2h(p)}}{2\pi e}\right).$$

Thus, in multiple description quantization, achieving a simultaneous reduction in the granular distortion by 1.53 dB for the two-channel and the side distortion is possible.

In single description quantization, an extra transmitted bit reduces the squared error distortion by a factor of 4 (this is seen in (1)). However, additional flexibility is achieved if multiple description quantization is used. If each R is increased by ½ bit, the two-channel distortion can be decreased by $2^{-(1+\alpha)}$ and the side distortion by $2^{-(1-\alpha)}$, for any $\alpha \in (0,1)$. This means that by using an extra bit, the distortions $\overline{d}_0$ and $\overline{d}_s$ can be made to decrease by different amounts as long as the decrease of the product is equal to 4.

From classical quantization theory, one skilled in the art appreciates that the gap between scalar quantization and the rate distortion bound may be closed by using vector quantizers with lattice codebooks. By following this approach, the gap between the two-channel distortion and the rate-distortion bound can likewise be closed. In particular, this approach allows for replacing the factor (1/12) in the expression for $\overline{d}_0$ in (3) with $G(\Lambda)$, the normalized second moment of the Voronoi region of a lattice point. The main question addressed here is that of simultaneously reducing $\overline{d}_1$. How can such a reduction be achieved and what quantity will replace the factor (1/12) in the expression for $\overline{d}_1$ in (3)? It will be shown through a constructive procedure that the distortion $\overline{d}_1$ can be reduced by solving a specific labeling problem. As will be shown, the quantity that replaces (1/12) is $G(S_l)$, the normalized second moment of a sphere in L dimensions.

Lattice-Based Multiple Description Vector Quantization

Figure 14:
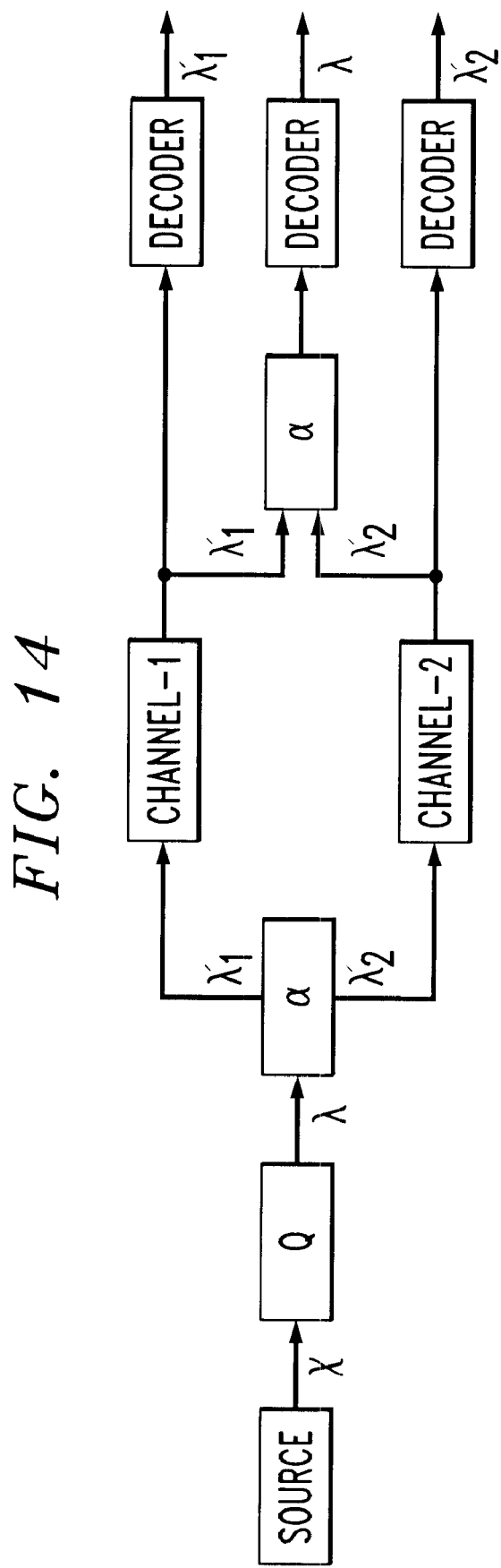
FIG. 14 is a block diagram of a multiple description vector quantizer (MDVQ) with a lattice codebook, according to an embodiment of the present invention.

A block diagram of a multiple description vector quantizer (MDVQ) with a lattice codebook is shown in FIG. 14. An L-dimensional source vector x is first encoded to the nearest vector $\lambda$ in a lattice $\Lambda \subset \mathcal{E}^L$. The quantizer mapping will be denoted by $\lambda = Q(x)$. Information about the selected codevector $\lambda$ is then sent across the two channels, subject to rate constraints imposed by the individual channels. This is done through a labeling function $\alpha$. At the decoder, if only channel 1 works, the received information is used to pick a vector $\lambda'_1$ from the channel 1 codebook. If only channel 2 two works, the information received over channel 2 is used to pick a codevector $\lambda'_2$ from the channel 2 codebook. If both channels work, enough information is assumed to be available decode to $\lambda$.

For the purposes of the present invention, channel 1 and channel 2 codebooks are assumed to be identical and equal to $\Lambda'$, a sublattice of $\Lambda$ of index N. Roughly speaking, this means that $\Lambda$ is N times as dense as $\Lambda'$. More precisely, $\Lambda'$ is a subgroup of $\Lambda$ and has precisely N cosets. In addition we will assume that $\Lambda'$ is geometrically similar to $\Lambda$, i.e., $\Lambda'$ can be obtained by scaling and rotating $\Lambda$.

The labeling function is now formally described. Because the information sent over channel 1 is used to identify a codevector $\lambda'_1$, and the information over channel 2 is used to identify a codevector $\lambda'_2$ both in the sublattice $\Lambda'$, we will assume that the labeling function, $\alpha$, is a mapping from $\Lambda$ into $\Lambda' \times \Lambda'$ and that $(\lambda'_1, \lambda'_1) = \alpha(\lambda)$. It is also convenient to define the component mappings $\lambda'_1 = \alpha_1(\lambda)$ and $\lambda'_2 = \alpha_2(\lambda)$. Note that to decode to $\lambda$ when both channels work, it is necessary that $\alpha$ be one-to-one.

Given $\Lambda$, $\Lambda'$ and $\alpha$, there are three distortions and two rates associated with an MDVQ. For a given x mapped to the triple $(\lambda, \lambda'_1, \lambda'_2)$ by the MDVQ, the two-channel distortion $d_0$ is given by $\|x-\lambda\|^2$, the channel 1 distortion $d_1$ by $\|x-\lambda'_1\|^2$ and the channel 2 distortion $d_2$ by $\|x-\lambda'_2\|^2$ (the norm of an L-dimensional vector $x=(x1, x2, \ldots, xL)$ is assumed to be given by (1/L)

$$\sum_{i=1}^{L} x_i^2,$$

i.e., the norm is dimension normalized). The corresponding average distortions are denoted by $\overline{d}_0$, $\overline{d}_1$ and $\overline{d}_2$.

An entropy coder can be used to transmit the labeled vectors at a rate arbitrarily close to the entropy, i.e., $R_i = H(\alpha_i(Q(X)))/L$, i=1,2, where H is the entropy of its argument.

The problem is to design the labeling function $\alpha$ so as to minimize $\overline{d}_0$ subject to $\overline{d}_1 \leq D_1$ and $\overline{d}_2 \leq D_2$, given rates $(R_1, R_2)$ and distortions $D_1$ and $D_2$. For the purposes of the present invention, the balanced case is used, which is defined to be the case when $R_1 = R_2 = R$ bits/sample and $D_1 = D_2$.

Notation, Definitions, Distortion and Rate Computation

The points to be labeled belong to a lattice $\Lambda$, and the labels will consist of ordered pairs of points from a sublattice $\Lambda'$. Lattice points will be denoted by $\lambda$, possibly with subscripts, and sublattice points will be denoted by $\lambda'$ or $\lambda''$, possibly with subscripts. The term "edge" will refer to lines joining points of the sublattice $\Lambda'$. The underlying graph has as vertex set the points of $\Lambda'$. An undirected edge will be denoted by e and its two directed versions by $\vec{e}$ and $\cev{e}$. A dimension-normalized inner-product, defined in the glossary at the end of this application, will be used.

A memoryless source is assumed with probability density function (pdf) p. The L-fold pdf will be denoted by $p_L$ where $$p_L((x_1, x_2, \ldots, x_L)) = \prod_{i=1}^{L} p(x_i).$$

Clearly, the differential entropies satisfy the relation $h(p_L) = Lh(p)$.

The Voronoi (or nearest neighbor) region $V(\lambda)$ of a point $\lambda \in \Lambda$ is defined by $$V(\lambda) = \{x : \|x-\lambda\| \leq \|x-\lambda'\|, \forall \lambda' \in \Lambda\}. \quad (5)$$

Each sublattice point $\lambda' \in \Lambda'$ is associated with a discrete Voronoi set (containing N elements)

$$V_0(\lambda') \triangleq \{\lambda : \|\lambda - \lambda'\| \leq \|\lambda - \lambda''\|, \forall \lambda'' \in \Lambda'\}, \quad (6)$$

where in equations (5) and (6) ties are broken in some prearranged manner.

The labeling function $\alpha$ is assumed to be one-to-one. If $\alpha(\lambda) = (\lambda'_1, \lambda'_2)$, then $\alpha_1(\lambda) = \lambda'_1$ and $\alpha_2(\lambda) = \lambda'_2$, i.e., $\alpha_1, \alpha_2$ are the component functions. Each label can be thought of as a directed edge of a graph with vertex set $\Lambda'$. In other words, $\vec{e} = (\alpha_1(\lambda), \alpha_2(\lambda))$ is the (directed) edge used to label $\lambda$. The corresponding undirected edge $e = \{\alpha_1(\lambda), \alpha_2(\lambda)\}$ is referred to as the undirected edge or label associated with $\lambda$. The undirected edge labeling $\alpha_u$ is defined as follows: if $\vec{e} = \alpha(\lambda)$, then $e = \alpha_u(\lambda)$, i.e., $\alpha_u$ maps $\lambda$ to its undirected label. Note that while a directed edge is uniquely associated with a lattice point, an undirected edge will in general be associated with two lattice points, one for each orientation of the edge. The main reason for introducing $\alpha_u$ is that its construction logically precedes that of $\alpha$.

Certain sets associated with the two maps will play a central role in the development. The first is $\epsilon_d(\lambda') = \alpha(V_0(\lambda'))$, the set of all labels for points in $V_0(\lambda')$ (the subscript d indicates the edges are directed). The corresponding set of undirected edges is referred to as $\epsilon_u(\lambda')$. More specifically, $\epsilon_u(\lambda') = \alpha_u(V_0(\lambda'))$. Note that each edge in $\epsilon_u(\lambda')$ has at least one directed version in $\epsilon_d(\lambda')$ and every edge in $\epsilon_d(\lambda')$ has its undirected version in $\epsilon_u(\lambda')$. First, $\epsilon_u(0)$ is determined, and then used to construct $\alpha_u$. To construct $\alpha$, it is then necessary to choose a particular orientation for the edge $\alpha_u(\lambda)$. This will be done by defining an edge orientation map $s(\alpha_u(\lambda), \lambda)$ that associates with $\alpha_u(\lambda)$ and $\lambda$ a particular edge orientation, i.e., one of the directed edges $\vec{e}$ or $\vec{\tilde{e}}$, where $e = \alpha_u(\lambda)$. We then define $\alpha_u(\lambda) = s(\alpha_u(\lambda), \lambda)$.

Distortion Computation

The average two-channel distortion $\bar{d}_0$ is given by $$\bar{d}_0 = \sum_{\lambda \in \Lambda} \int_{V(\lambda)} \|x - \lambda\|^2 p_L(x) dx. \quad (7)$$

Because the codebook of the quantizer is a lattice, all the Voronoi regions are congruent. Furthermore, upon assuming that each Voronoi region is small and upon letting v denote the L-dimensional volume of a Voronoi region, the following two-channel distortion is obtained:

$$\bar{d}_0 = \frac{\int_{V(0)} \|x\|^2 dx}{v} \quad (8)$$

which in terms of the normalized second moment $G(\Lambda)$, defined by $$G(\Lambda) = \frac{\int_{V(0)} \|x\|^2 dx}{v^{1+2/L}}, \quad (9)$$

is given by $$\bar{d}_0 = G(\Lambda) v^{2/L}. \quad (10)$$

Expressions for the average distortions $\bar{d}_1$ and $\bar{d}_2$ and $\bar{d}_s$ $(\bar{d}_1 + \bar{d}_2)/2$. are derived below. When only description 1 is available, the distortion is given by $$\bar{d}_1 = \sum_{\lambda \in \Lambda} \int_{V(\lambda)} \|x - \alpha_1(\lambda)\|^2 p_L(x) dx \quad (11)$$

$$= \sum_{\lambda \in \Lambda} \int_{V(\lambda)} \|x - \lambda + \lambda - \alpha_1(\lambda)\|^2 p_L(x) dx$$

$$= \sum_{\lambda \in \Lambda} \int_{V(\lambda)} \|x - \lambda\|^2 p_L(x) dx +$$

$$\sum_{\lambda \in \Lambda} \int_{V(\lambda)} \|x - \alpha_1(\lambda)\|^2 p_L(x) dx +$$

$$2 \sum_{\lambda \in \Lambda} \int_{V(\lambda)} \langle x - \lambda, \lambda - \alpha_1(\lambda) \rangle p_L(x) dx$$

$$= \bar{d}_0 + \sum_{\lambda \in \Lambda} \|\lambda - \alpha_1(\lambda)\|^2 P(\lambda) +$$

$$2 \sum_{\lambda \in \Lambda} \left\langle \int_{V(\lambda)} x p_L(x) dx - \int_{V(\lambda)} \lambda p_L(x) dx, \lambda - \alpha_1(\lambda) \right\rangle$$

$$\stackrel{(a)}{=} \bar{d}_0 + \sum_{\lambda \in \Lambda} \|\lambda - \alpha_1(\lambda)\|^2 P(\lambda) \quad (12)$$

where $P(\lambda)$ is the probability of lattice point $\lambda$, and (a) follows by assuming that $\lambda$ is the centroid of its Voronoi region. This is true for the uniform density. For nonuniform densities, there is an error term which goes to zero with the size of the Voronoi region. The first term in (12) is the two-channel distortion and the second term is the excess distortion which is incurred when channel 2 fails. Note that for a given $\Lambda$, only the excess distortion term is affected by the labeling $\alpha$.

It is also useful (as a design guide and for asymptotics which follow) to write down a slightly different expression for the side distortion with the sum being taken over the edge set $\epsilon_d \stackrel{def}{=} \cup_{\lambda' \in \Lambda'} \epsilon_d(\lambda')$. Let $\vec{e} = (\lambda'_1, \lambda'_2)$ label $\lambda$. $d_1(\vec{e}) = \|\lambda - \lambda'_1\|^2$ and $d_2(\vec{e}) = \|\lambda - \lambda'_2\|^2$ and $d_s(e) = (d_1(\vec{e}) + d_2(\vec{e}))/2$ are defined above. In terms of these quantities, the following holds:

$$\bar{d}_s = \bar{d}_0 + \sum_{\vec{e}_s} d_s(\vec{e}) P(\vec{e}) \vec{e} \epsilon \epsilon_d \quad (13)$$

$$= \bar{d}_0 + \sum_{\lambda' \in \Lambda'} \sum_{\vec{e} \in \epsilon_d(\lambda')} d_s(\vec{e}) P(\vec{e})$$

where the probability of the edge $P(\vec{e})$, is equal to the probability of the lattice point that it labels, i.e., $P(\vec{e}) = P_0(\lambda)$).

Rate Computation

Expressions for the rate (in bits/sample) are derived below. Let $R_0$ be the rate required to address the two-channel codebook for a single channel system. This quantity is useful for evaluating the two-channel distortion as well as for evaluating the rate overhead associated with the multiple description system. First, an expression for $R_0$ is derived, and then the rate (per-channel) R of the multiple description system is determined.

To derive expressions for $R_0$ and R, each quantizer bin is recognized to have identical volume v and $p_L(x)$ is recognized to be approximately constant over Voronoi regions of the sublattice $V(\lambda')$. The second assumption is valid in the limit as the Voronoi regions become small and is standard in asymptotic quantization theory.

The rate $R_0 = H(Q(X))$ is given by $$R = -(1/L)\sum_\lambda \int_{V(\lambda)} p_L(x)dx \log_2 \int_{V(\lambda)} p_L(x)dx \qquad (14)$$

$$\approx -(1/L)\sum_\lambda \int_{V(\lambda)} p_L(x)dx \log_2 p_L(\lambda)v$$

$$\approx h(p) - (1/L)\log_2(v).$$

For R, the entropy $H(\alpha_1(Q(X)))$ is evaluated, and then the approximation that $p_L(X)$ is roughly constant over each Voronoi region of $\Lambda'$ is used to get $$R = -(1/L)\sum_{\lambda' \in \Lambda'} \left( \sum_{\lambda' \in \alpha_1^{-1}(\lambda')} \int_{V(\lambda)} p_L(x)dx \right) \log_2 \left[ \left( \sum_{\lambda' \in \alpha_1^{-1}(\lambda')} \int_{V(\lambda)} p_L(x)dx \right) \right] \qquad (15)$$

$$\approx -(1/L)\sum_{\lambda' \in \Lambda'} \int_{V(\lambda)} p_L(x)dx \log_2 p_L(\lambda')v$$

$$\approx -(1/L)\sum_{\lambda' \in \Lambda'} \int_{V(\lambda)} p_L(x) \log_2 p_L(\lambda')dx + \log_2(Nv)$$

$$\approx h(p) - (1/L)\log_2(Nv).$$

Observe that in the above equation, the term Nv is simply the volume of a fundamental region of the sublattice $\Lambda'$ (since it has index N in $\Lambda$). Upon writing (15) in terms of $R_0$, the following is obtained:

$$R = R_0 - (1/L)\log_2(N). \qquad (16)$$

A single channel system would have used $R_0$ bits/sample. Instead a multiple description system uses a total of $2R = 2R_0 - (2/L)\log_2(N)$ bits/sample, and so the rate overhead is $R_0 - (2/L)\log_2(N)$.

Construction of the Labeling Function

A labeling function $\alpha$ is now sought for which $\Sigma_{\vec{e} \in \epsilon_{d(\lambda')}} d_s(\vec{e})$ is minimized and is independent of $\lambda'$. Since the details are complicated, the first example for the $A_2$ lattice is determined explicitly. Certain general principles are then identified and used to construct labelings for other lattices.

Labeling the Two-Dimensional Hexagonal Lattice, $A_2$

The lattice $A_2$ may be considered to be a subset of $\mathbb{R}^2$ or as a subset of $\mathbb{C}$. Since each approach has its advantages, it is convenient to switch back and forth between the two representations. We consider the lattice $A_2$ at unit-scale to be generated by the vectors $\{1,\omega\} \subset \mathbb{C}$, where $\omega = -1/2 + i\sqrt{3}/2$. The associated Gram matrix is $$\begin{pmatrix} 1 & -1/2 \\ -1/2 & 1 \end{pmatrix}$$

and fundamental volume is $\sqrt{3}/2$. $\Lambda'$, a sublattice of $\Lambda$ is said to be geometrically similar to $\Lambda$ if it can be obtained by scaling and rotating or reflecting $\Lambda$. To be more specific, if matrix G' generates $\Lambda'$ and G generates $\Lambda$, then $\Lambda'$ is geometrically similar to $\Lambda$ if and only if G'=cUGB, for some nonzero scalar c, integer matrix U with determinant $\pm 1$, and real orthogonal matrix B. The index N is defined as the ratio of the fundamental volumes of $\Lambda'$ and $\Lambda$ and is given in terms of the scale factor c by $N = c^2$. It can be shown that $\Lambda'$ is similar to $\Lambda$ if and only if N is of the form $a^2 - ab + b^2$, a, b $\in$ $\mathbb{Z}\mathbb{Z}$ and that $\Lambda'$ is generated by $u = a + b\omega$, and $v = \omega(a + b\omega)$. In addition to this restriction on N, in one embodiment of the present invention it is assumed that $N = \Sigma_{i=0}^{K} A_i$, where $A_i$ is the number of lattice points at squared distance i from the origin. In other words, it is assumed that N is the number of points in the first K(N) shells of the lattice. There are infinitely such values N. As an example, the number N=31 is a good one for the hexagonal lattice, since $N = A_0 + A_1 + A_2 + A_3 + A_4$ ($A_0 = 1, A_1 = 6, A_2 = 6, A_3 = 6, A_4 = 12$) and since it is also of the form $a^2 - ab + b^2$, with a=5, b=-1.

AN EXAMPLE

The following example of a labeling function uses a reuse index N=31. The following are the steps in constructing a labeling function.

1. Find a sublattice with index equal to the reuse index.
2. Determine the discrete Voronoi set $V_0(0)$.
3. Determine an undirected label e for every point $\lambda \in V_0(0)$.
4. Extend the labeling to the entire lattice using the shift property of the undirected labels.
5. Given $\lambda$ and its undirected label e, determine the correct oriented label $\vec{e}$ based on the color of the edge c(e).

Figure 15:
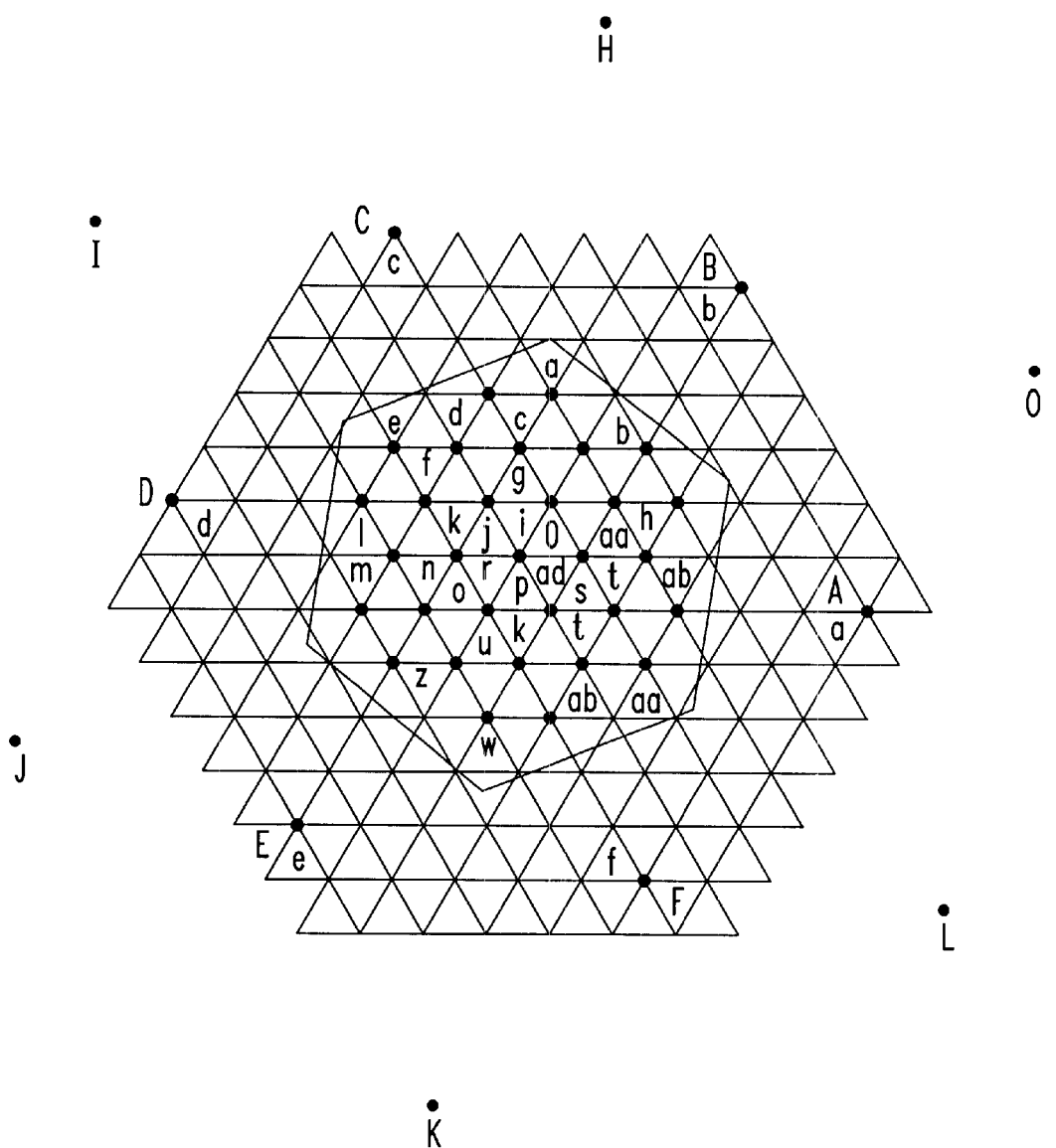
FIG. 15 displays a schematic part of the lattice which also shows sublattice points, according to an embodiment of the present invention.
Figure 16:
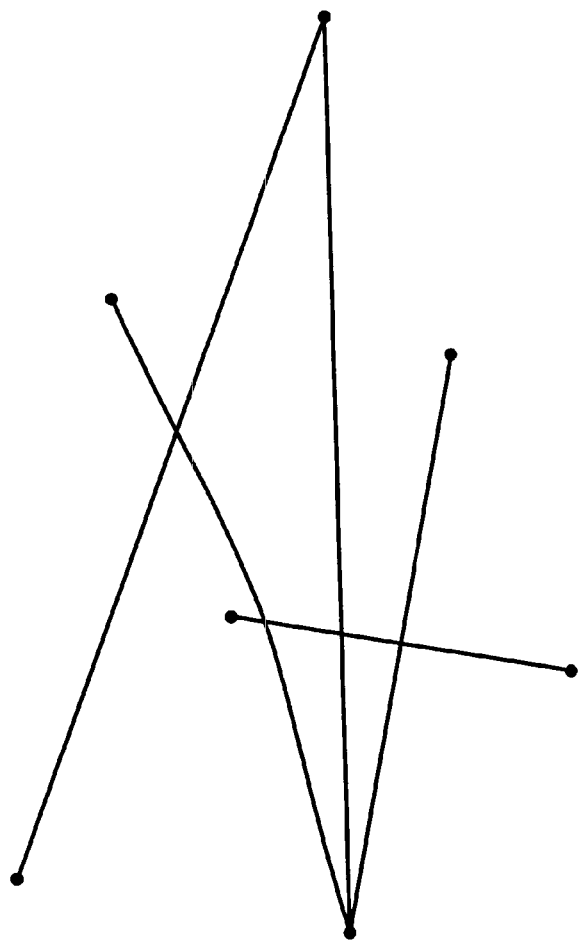
FIG. 16 displays a set of edges in an example of an embodiment of the present invention.

A sublattice $\Lambda'$ of index equal to 31 is obtained by considering all points of the form $au + bv$, with $u = 5 - \omega$ and $v = \omega(5 - \omega)$. A part of the lattice which also shows sublattice points is illustrated in FIG. 15. Lattice points have been labeled with lower case letters a, b, c, ... and sublattice points have been labeled with upper-case letters O, A, B, C, ... To fix the coordinate system, note that the sublattice point O is the origin of the complex plane and the lattice points a and c have representations 1 and $\omega$ respectively. Relative to this basis, the representations of sublattice points A and C are $5-\omega$ and $\omega(5-\omega)$, respectively. The discrete Voronoi set $V_0(0) = \{0, a, b, c, \ldots, y, z, aa, ab, ac, ad\}$ is also shown in FIG. 15. Note that $|V_0(0)| = 31$. Points in $V_0(0)$ will be labeled using directed edges obtained from the following set of 28 undirected edges:

$$\epsilon_d(0) = \{\{O,O\}, \qquad (17)$$

$$\{O,A\}, \{O,B\}, \{O,C\}, \{O,D\}, \{O,E\}, \{O,F\}, \{A,C\}, \{B,D\},$$
$$\{C,E\}, \{D,F\}, \{E,A\}, \{F,B\}, \{A,D\}, \{B,E\}, \{C,F\},$$

$$\{G,D\}, \{G,E\}, \{H,E\}, \{H,F\}, \{I,F\}, \{I,A\}, \{J,B\}, \{J,A\}, \{K,C\},$$
$$\{K,B\}, \{L,C\}, \{L,D\}\}, \qquad (18)$$

which are illustrated in FIG. 16. Each point in $V_0(0)$ is then associated with an edge in $\epsilon_u(0)$ as shown in FIG. 10. This association was done by hand. The only constraint is that if two lattice points sum to zero, then so do the midpoints of their corresponding edges. This is seen to be true in the table, where lattice points that sum to zero have been placed in the same row. To complete the labeling a directed edge should be assigned to each lattice point based on the color c(e) (0 or 1 valued) associated with that edge. This is illustrated for two cases-for a point that lies in $V_0(0)$ and for a point that lies outside $V_0(0)$.

First consider the point ac, which has been assigned the edge e={C,L}={1+6ω,4−7ω}. This edge has midpoint $\mu$=5/2−1/2ω and it follows from (21) that the color c(e)=⌊(5/2)/3⌋=0. The specific orientation of e is then determined using (22) as follows. Set $\lambda'_1$=1+6ω, $\lambda'_2$=4−7ω, $\mu$=5/2−1/2ω and $\lambda$=1−2ω and obtain <$\lambda'_1$−$\lambda'_2$,$\lambda$−$\mu$>=−15/2<0. From (22), it follows that the directed edge is (L,C).

Now consider a lattice point $\lambda$=18+10ω ∉ $V_0(0)$. The nearest lattice point is $\lambda'$=17+9ω. Compute the difference $\lambda$−$\lambda'$=(1+ω) (the point b) and use this to look up the corresponding undirected label in FIG. 10. This gives $\alpha_u$(1+ω)={0,B}={0,6+5ω}. Using the shift property, the undirected label for $\lambda$ is then obtained by shifting the edge by $\lambda'$ to give $\alpha_u(\lambda)$=e={17+9ω, 23+14ω}. To determine the correct edge orientation for e, the color of the edge is first determined using (21). In this case, the color c(e)=1. Now use the direction rule (23) with $\lambda'_1$=17+9ω, $\lambda'_2$=23+14ω, $\mu$=20+23/2ω and $\lambda$=18+10ω to get <$\lambda'_1$−$\lambda'_2$,$\lambda$−$\mu$>=10. Thus $\alpha(\lambda)$=(23+14ω, 17+9ω).

The following is an example of the decoding operation. Assume that $\vec{e}$=(23+14ω, 17+9ω)) and write its undirected version using the basis vectors of the sublattice u and v to get {4u+3v, 3u+2v}. Using FIG. 10, one must now look for an equivalent edge. One such edge is {O, B}={0, u+v}. Determine the shift required to make the edges coincide. In this case {4u+3v}−$\lambda'$={u+v, 0}, with $\lambda'$=3u+2v. Upon looking up FIG. 10, the lattice point b is found with representation 1+ω having the undirected edge {O, B} as label. This point is shifted by adding $\lambda'$=3u+2v to get one of the candidate points $\lambda$=3u+2v+(1+ω)=18+10ω. The other candidate point is obtained from the Property 3 of the labeling function (the sum of the endpoints of an edge is equal to the sum of the points that it labels) and is 22+13ω. One skilled in the art would appreciate that another edge exists in FIG. 10 that is equivalent to the edge for which decoding is desired. However, exactly the same set of candidate points would be obtained by using this edge. To determine the correct point, since c(e)=1, the decoding rule given by (24) is used. The inner product <$\lambda'_1$−$\lambda'_2$,$\lambda$−$\mu$> is negative and it follows that the encoded point is indeed $\lambda$=18+10ω.

Several facts are best observed at this point. In FIG. 10, two kinds of undirected edges (of positive length) are shown, the first of which are diameters of a circle centered at 0, and the second of which are not. The diameters are the edges {A,D}, {B,E} and {C,F}. Both orientation of a diameter are used to label points in $V_0(0)$, whereas only one orientation of a non-diameter is used. For an edge which is not a diameter, the remaining orientation labels a lattice point outside $V_0(0)$ as determined by the shift property. For example, consider the label {L,C}. The directed label (L,C) is the label for the point ac=1−2ω∈$V_0(0)$. The lattice point labeled by (C,L) is given by 2$\mu$−(1−2ω)=5−ω−(1−2ω)=4+ω, which belongs to the discrete Voronoi set of the sublattice point A.

The labeling function shown in FIG. 10 exhibits additional symmetry that has not, thus far, been used. If a point is rotated by a multiple of π/3 radians about the origin, its corresponding undirected label is also rotated by the same amount about the origin. Consider Γ={$\gamma_t$=exp ikπ/3, k=0, 1, ... , 5}, a rotation group of order 6. By considering equivalence classes relative to this group, the size of this table can be reduced by listing only the undirected edges for the points {o, a, g, n, t, s}.

The above example illustrates the basic steps that are to be followed to label the points in Λ. Additional details and some underlying theory is presented next.

General Principles

The construction of the labeling function involves the following steps:

1. Selection of a geometrically similar sublattice of a given index N.
2. Construction of $V_0(0)$, the discrete Voronoi set of 0.
3. Establishing a mapping between elements of $V_0(0)$ and undirected edges in such a say that certain constraints are satisfied. Optimal construction requires that a specific linear programming problem be solved.
4. Extension of the mapping to the entire lattice.
5. Identification of a specific directed edge to associate with a lattice point, once the undirected edge is known.

A Guiding Principle

Once a sublattice of the correct index has been identified, the next task is to determine a set of labels for lattice points in the set $V_0(0)$.

Figure 17:
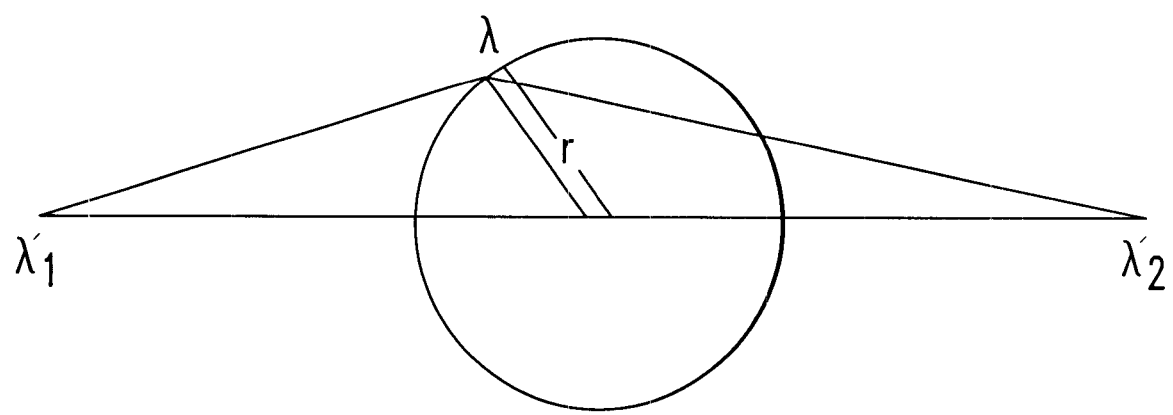
FIG. 17 displays a represent of a lattice point according to an embodiment of the present invention.

Suppose that $\lambda$ receives the label $\vec{e}$=$\lambda'_1$−$\lambda'_2$ as illustrated in FIG. 17. Then $d_s(\vec{e})$ satisfies the identity $$2d_s(\vec{e}) = \|\lambda - \lambda'_1\|^2 + \|\lambda - \lambda'_2\|^2 = (1/2)\|\lambda'_1 - \lambda'_2\|^2 + 2r^2, \quad (19)$$

where $r^2$=$\|\lambda - \lambda'_1 + \lambda'_2/2\|^2$. From this, it can be inferred that, to keep $\bar{d}_s(\vec{e})$ small, $\lambda'_1$ and $\lambda'_2$ should be as close together as possible, and, $\lambda$ should be as close as possible to their midpoint. Thus, in one embodiment of the present invention, the shortest possible edge is chosen with midpoint as close as possible to the point to be labeled.

Construction of $\epsilon_u(0)$ and $\alpha_u$

Figure 18:
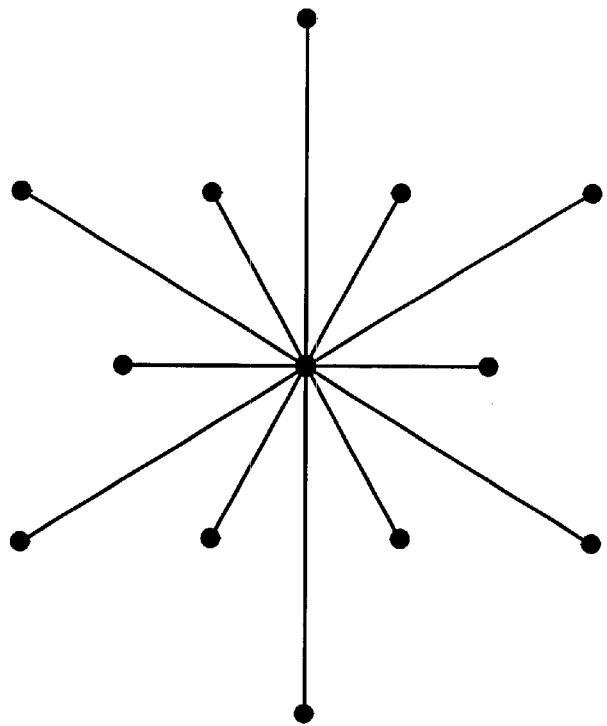
FIG. 18 displays the shortest possible edges, according to an embodiment of the present invention.

The starting point for determining the set of edges is $\epsilon_d|_{a1=0}$ which is chosen as the set of N shortest undirected sublattice edges of the form (0,$\lambda'$). This set is illustrated in FIG. 18. Observe that edges in $\epsilon_d|_{a1=0}$ come in equivalent pairs. For every $\lambda \in V_0(0)$ and $\vec{e} \in \epsilon_d|_{a1=0}$, determine $d_s(\lambda, [e])$=min $\tilde{e} \in [e] d_s(\lambda,\tilde{e})$ and let $\alpha^*(\lambda,[e])$=arg min $\tilde{e} \in [e] d_s(\lambda, \tilde{e})$. In other words, $\alpha^*(\lambda,[e])$ is the "closest" edge to $\lambda$ which lies in the same equivalence class as e. Clearly, from the guiding principle, the "closest" edge will be the one whose midpoint is the closest to $\lambda$. Let $\beta:V_0(0) \to \epsilon_u|_{a1=0}$ be one-to-one. Let $\beta^*$ minimize $\Sigma_{\lambda \in V_0(0)} d_s(\lambda,[\beta(\lambda)])$ subject to the constraint that equivalent points are mapped to equivalent edges. $\beta^*$ maps a lattice point to an edge coset element in $\epsilon_u|_{a1=0}$ in an optimal way, thus identifying the best edge coset for a given lattice point. Define $a_u(\lambda)$=$\alpha^*(\lambda,[\beta^*(\lambda)])$. Since $\beta^*$ identifies the optimal edge coset for each lattice point and $\alpha^*$ identifies the best coset representative, given the lattice point and the coset, we obtain the optimal edge for each lattice point by composing these two mappings. It follows that $\epsilon_u(0)$={$a_u(\lambda):\lambda \in V_0(0)$}. Extend the mapping to the lattice Λ using the rule $a_u(\lambda+\lambda')$=$a_u(\lambda)+\lambda'$.

The constraint imposed on the mapping $\beta$ needs an explanation. It arises from the third assumption that was made about the labeling function, namely, the sum of the end points of an edge is equal to the sum of the two points that it labels. The argument is as follows. The points in $V_0(0)$ come in equivalent pairs. If two points in $V_0(0)$ are equivalent, they sum to 0. Consider the pair $\lambda_a$ and $-\lambda_a$ and an edge e. If the edge in [e], say $e_a$, which is closest to $\lambda_a$, has midpoint a, then the edge in [e] which is closest to $-\lambda_a$ will have midpoint $-\lambda_{-a}$. Thus $\epsilon_u(0)$ contains the edges $e_a$ and $-e_a$ (which may be identical). Now from the shift property, $e_a$ also lies in $\epsilon_u(2a)=\epsilon_u(0)+2a$ (note that 2a is a sublattice point) and the point it labels, say $\lambda_b$, is given by $\lambda_b=-\lambda_a+2a$. Thus the two points that are labeled using the undirected edge $e_a$, namely $\lambda_a$ and $\lambda_b$ satisfy $\lambda_a+\lambda_b=2a$, i.e., the midpoint of the edge coincides with the midpoint of the points that receive this edge as label. To summarize, the constraint is a sufficient condition to ensure that the labeling function has Property 3.

It is to be noted that the optimal mapping $\beta^*$ can be obtained using standard techniques in linear programming. Also observe that if we define the group $\Gamma=\{1,-1\}$, we may obtain $\beta^*$ as an unconstrained solution by considering only $V_0(0)|\Gamma$ and $\epsilon_u|_{a1=0}|\Gamma$. This problem is one of matching $(N-1)/2$ lattice points to $(N-1)/2$ edge classes. Further reductions in complexity are obtained by using a larger group, in which case the problem is further reduced to matching $(N-1)/o(\Gamma)$ points to $(N-1)/o(\Gamma)$ edge classes, $o(\Gamma)$ being the order of the group. In this case ($A_2$ lattice) the group $\Gamma$ has order 6.

The mapping $\alpha_u$ identifies the edge to be associated with $\lambda$ up to the orientation of the edge. The correct orientation is determined through an edge orientation rule and is related to the issue of maintaining exact balance between the two descriptions. This is described next.

Balance

Figure 19:
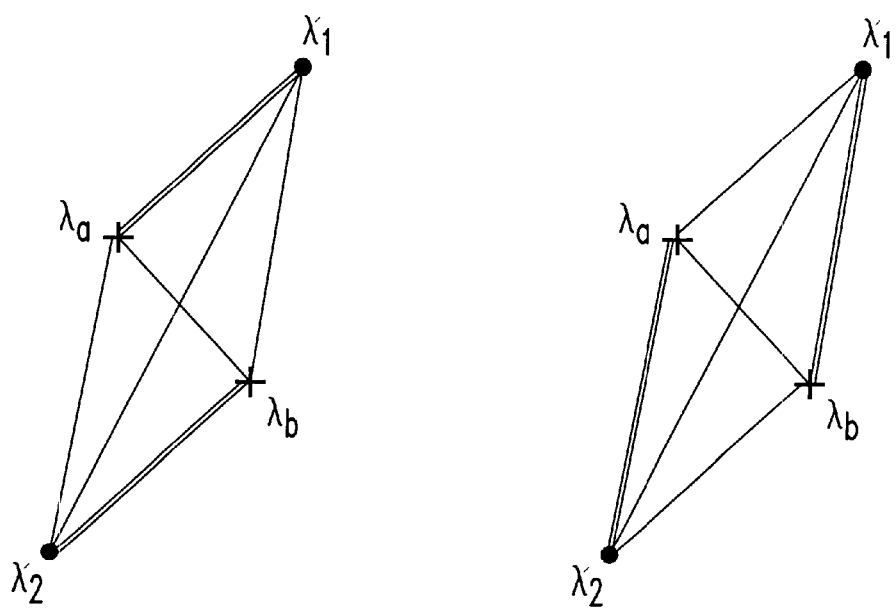
FIG. 19 displays an embodiment of the present invention that includes at least two ways of establishing a one-to-one correspondence between the point set and the set of two directed edges $\{\vec{e}, \vec{e}\}$.
Figure 20:
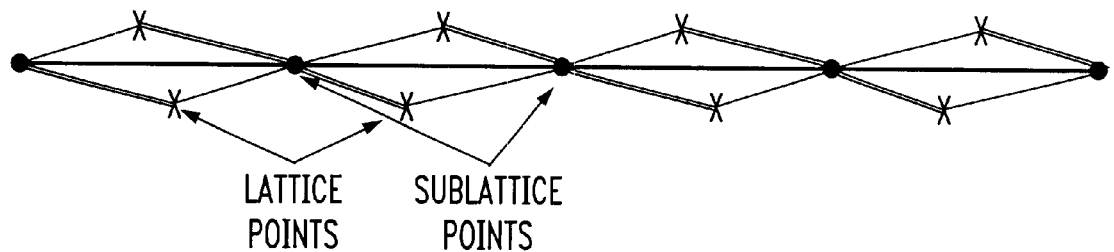
FIG. 20 displays an illustration of an alternating structure along a straight line for maintaining balance between the two descriptions, according to an embodiment of the present invention.

Given an edge e and points that it labels $\{\lambda_a,\lambda_b\}$, at least two ways of establishing a one-to-one correspondence exist between the point set and the set of two directed edges $\{\vec{e},\vec{\varepsilon}\}$. The two possible correspondences are shown in FIG. 19. The first rule favors the second description, the second favors the first. Observe that because of the specific configuration, the distortions are anti-symmetric, i.e., $d_1(e)$ with the first selection rule is equal to $d_2(e)$ for the second and $d_2(e)$ for the first rule is equal to $d_1(e)$ for the second. Because of this anti-symmetry, balance is attainable in an average sense by ensuring that the two correspondences are equally used. To be more specific, the two correspondences are alternated along any straight line of the lattice as shown in FIG. 20. This is the purpose of the edge coloring rule which is described below.

Defining $\alpha_u$ on a Restricted Domain

The aim is to construct a mapping $\alpha_u$ between $V_0(0)$ and $\epsilon_u(0)$, subject to the constraints outlined in the previous section. The constraints, which we repeat here for convenience, state that if $\alpha_u$ maps 0 to $(0,0)$ and is onto, and maps equivalent points to equivalent edges, then $\alpha_u$ can be correctly extended to the entire lattice. The approach used is to reduce the problem to that of finding an unconstrained mapping from $\hat{V}_0(0)$, a subset of $V_0(0)$, onto $[\epsilon_u(0)]$, the set of equivalence classes of edges in $\epsilon_u(0)$. Two approaches are outlined: the first places minimal restrictions on the resulting mapping, whereas the second utilizes the inherent symmetries in the lattice more fully in order to reduce the complexity of finding an optimal mapping.

Approach 1

First, $\hat{V}_0(0)$ is constructed. There are $(N-1)$ non-zero lattice points in $V_0(0)$ and $M=(N+1)/2$ equivalence classes, resulting in a partition $P=\{P_1, P_2, \ldots, P_M\}$ (recall that points in $V_0(0)$ are equivalent if they sum to zero). Choose a single point from each equivalence class and place it in $\hat{V}_0(0)$. For this a sign is defined for each lattice point in such a way that each point in a class has a distinct sign ("plus" or "minus"). Only those points with positive signs are chosen. The sign is defined as follows:

$$\text{sgn}(a+b\omega) = \begin{cases} \dfrac{a}{|a|}, & a \neq 0, \\ \dfrac{b}{|b|}, & a = 0, b \neq 0, \\ 0, & a + b\omega = 0. \end{cases} \quad (20)$$

For $e \in \epsilon_u(0)$, let $[e] \subset \epsilon_u(0)$ be the set of edges equivalent to e. Supposing lattice point $\lambda$ is mapped to edge e, the corresponding cost is $d_s(\lambda,e) \overset{\text{def}}{=} \|\lambda-\lambda'_1\|^2+\|\lambda-\lambda'_1\|^2$. $d_s(\lambda,[e])=\min_{e \in [e]} d_s(\lambda,e)$ is defined. This is the cost of labeling $\lambda$ with the "closest" edge from a single equivalence class. It now remains to determine the best matching between lattice points and equivalence classes of the edges. To describe an embodiment of the present invention, a fully connected bipartite graph is displayed with each left hand node corresponding to $\lambda \in \epsilon_u(0)$. The objective is to find a minimum weighted matching for this graph such that $\Sigma_\lambda d_s(\lambda,[e])$ is minimized.

This is a well-known combinatorial optimization problem and several algorithms are known for solving it (the best-known is the so-called Hungarian method). Once the optimum matching is found, a lattice point $\lambda$ is matched with the closest edge from the chosen class. The lattice point equivalent to $\lambda$ receives the other edge from this class as a label if the class contains two edges. If not, it receives the same edge as label.

Approach 2

Further reductions are possible in the size of the matching problem—though with a possible penalty in terms of the optimality of the resulting solution. For the $A_2$ lattice, let $\tau(\lambda)=\exp(i\pi/6)\lambda$ and consider the group $\tau$ generated by $\tau$. Define two lattice points $\lambda_1 \in V_0(\lambda'_1)$ and $\lambda_2 \in V_0(\lambda'_2)$ to be equivalent if $\tau(\lambda_1-\lambda'_1)=\lambda_2-\lambda'_2$ for some $\tau \in \tau$. Once again, a one-to-one correspondence can be set up between single representative lattice points from each class and equivalence classes of the edges. Any group $\tau$ will work as long as the orbits of this group contain entire equivalence classes as defined earlier.

An Edge Coloring Rule

Each edge e is assigned a bit (color) $c(e)$ as follows. The two colors can be labeled 0 and 1, or, which is more convenient for drawing pictures, red and green. Consider an edge of the form $(a+b\omega, c+d\omega)$. Let $\Delta_1=|c-a|$ and let $\Delta_2=|d-b|$. Then $$c(e) = \begin{cases} 0, & \text{if } \Delta_1 > 0 \text{ and } \lfloor (c+a)/(2\Delta_1) \rfloor \text{ is even,} \\ & \text{or if } \Delta_1 = 0 \wedge \lfloor (d+b)/(2\Delta_2) \rfloor \text{ is even,} \\ 1, & \text{otherwise.} \end{cases} \quad (21)$$

This coloring rule ensures that adjacent edges along any straight line have a different color. Note that the color does not depend on the orientation of an edge, i.e., $\vec{e}$, $\vec{\varepsilon}$ and e have the same color. The coloring rule is a parameter in the edge and point selection rules that is defined below.

Edge Direction Rule and Point Selection Rule

Given an (undirected) edge e, and a point λ for which this edge is a label, an orientation or direction is chosen for the edge using a rule that depends on the color of the edge. Let $e=\{\lambda'_1, \lambda'_2\}$ and let $\mu=(\lambda'_1+\lambda'_2)/2$. The two rules $s_c(e, \lambda)$, c=0,1, c the color of the edge, are defined as follows (the symbol x denotes the cross- or vector-product of two vectors):

$$s_0(e,\lambda)=\{(\lambda'_1,\lambda'_2), <\lambda'_1-\lambda'_2,\lambda-\mu>>0, \text{ or } <\lambda'_1-\lambda'_2,\lambda-\mu>=0, \text{ and } \text{sign}((\lambda'_1-\lambda'_2)\times(\lambda-\mu))>0(\lambda'_2,\lambda'_1), \text{ otherwise}. \quad (22)$$

and $$s_1(e,\lambda)=\{(\lambda'_2,\lambda'_1), <\lambda'_1-\lambda'_2,\lambda-\mu>>0, \text{ or } <\lambda'_1-\lambda'_2,\lambda-\mu>=0, \text{ and } \text{sign}((\lambda'_1-\lambda'_2)\times(\lambda-\mu))>0(\lambda'_1,\lambda'_2), \text{ otherwise}. \quad (23)$$

Observe that the result of either rule is the same whether we write $e=\{\lambda'_1,\lambda'_2\}$ or $e=\{\lambda'_2,\lambda'_1\}$.

For decoding, since two lattice points receive a label from a given undirected edge, it is necessary to be able to tell which point is being labeled, given the edge orientation. This is the reverse of the edge direction rule. Thus, given a directed edge $\vec{e}=(\lambda'_1,\lambda'_2)$ with midpoint $\mu$ and a lattice point λ which could have received this label, the Point Selection Rule $g_c(\vec{e},\lambda)$ selects λ or $2\mu-\lambda$ based on the edge color c and is given by $$g_0(\vec{e}, \lambda) = \begin{cases} \lambda & \langle \lambda'_1 - \lambda'_2, \lambda - \mu \rangle > 0, \text{ or} \\ & \langle \lambda'_1 - \lambda'_2, \lambda - \mu \rangle = 0, \text{ and } \text{sign}((\lambda'_1 - \lambda'_2) \times (\lambda - \mu)) > 0 \\ 2\mu - \lambda & \text{otherwise.} \end{cases} \quad (24)$$

and $$g_1(\vec{e}, \lambda) = \begin{cases} 2\mu - \lambda & \langle \lambda'_1 - \lambda'_2, \lambda - \mu \rangle > 0, \text{ or} \\ & \langle \lambda'_1 - \lambda'_2, \lambda - \mu \rangle = 0, \text{ and } \text{sign}((\lambda'_1 - \lambda'_2) \times (\lambda - \mu)) > 0 \\ \lambda & \text{otherwise.} \end{cases} \quad (25)$$

Further Reduction in Complexity: Group Construction

Recall the constraint that was imposed on the mapping β. One skilled in the art can consider this map as an unconstrained mapping between cosets $\Lambda/\Lambda'/\Gamma$ and $\epsilon_u/\Lambda'/\Gamma$, where Γ is the group of rotations $\{1, -1\}$ (in complex notation since the discussion is about $A_2$). This results in having to establish a correspondence between two sets of size $(N-1)/2$, where 2 is the order of the group. Further reductions in complexity come from selecting a larger group that contains the group $\{1, -1\}$. For $A_2$, the group used is $\Gamma=\{\exp(ik\pi/6), k=0, 1, 2, 3, 4, 5\}$. This reduces the complexity of matching problem to sets of size $(N-1)/6$. Precise conditions that the group must satisfy, and why a group is used at all, is explained below.

Constructing the Map α

In terms of the notation previously established, we obtain α as follows. Given λ, let $e=\alpha_u(\lambda)$ and let $c=c(e)$. Then $\alpha(\lambda)=s_c(e, \lambda)$.

Numerical Results

Figure 21:
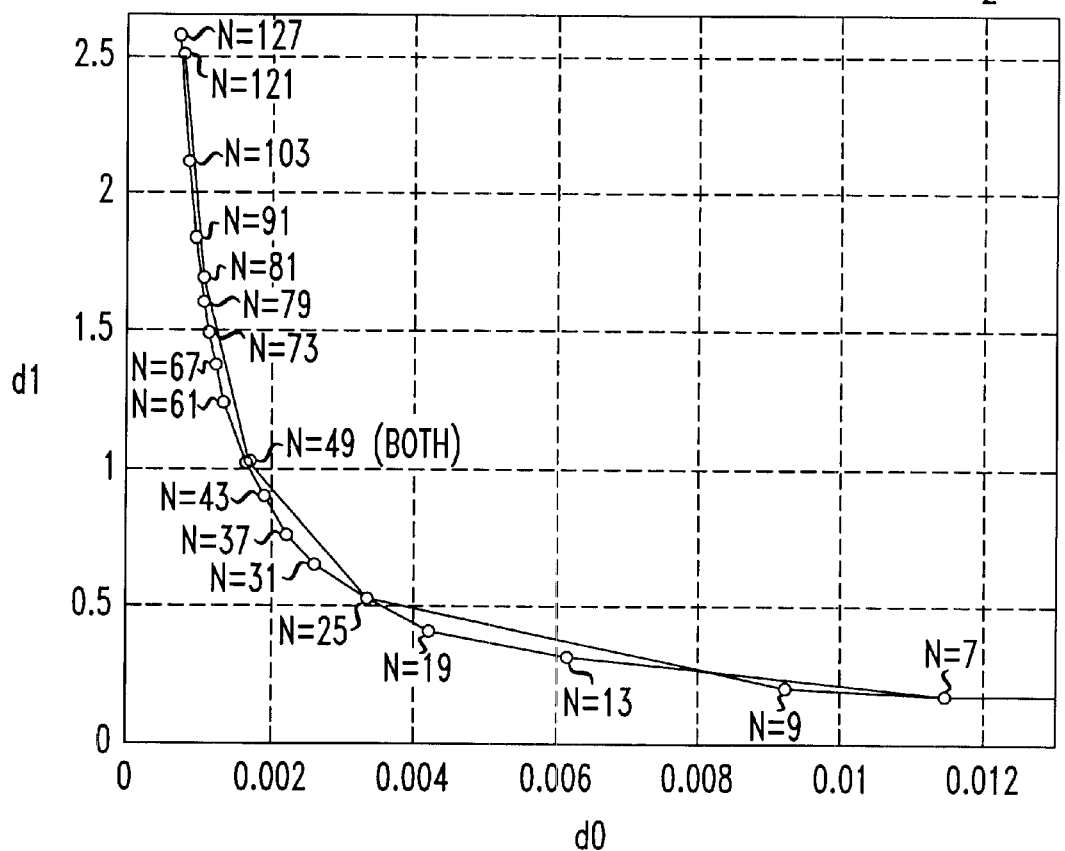
FIG. 21 displays the results of an optimization procedure, using a hexagonal lattice, according to an embodiment of the present invention.

For $A_2$, the results of the optimization procedure are displayed in FIG. 21 along with comparisons to the Z lattice. It is seen that small performance improvements are obtained. Another benefit is that many more points are obtained for (say) the side distortion in a given interval, as compared to the Z lattice.

Labeling Functions for General Lattices

In this section theory is developed for labeling a general lattice Λ using a sublattice Λ' with $[\Lambda:\Lambda']=N$. The basic steps remain the same as for $A_2$. The main difference comes from specific methods for selecting similar sublattices and the group construction. First, some general conditions are established that the group must satisfy Specific groups and sublattice generator matrix constructions will then be given for specific lattices. The generator matrix for Λ will be denoted by G and that for the sublattice by $c\tilde{G}G$, where the columns of the generator matrices are the basis vectors for the lattice.

Sufficient Conditions for the Group, Γ

In all cases, the smallest group to use is $\Gamma=\{1_L, -1_L\}$, where $1_L$ is the L-dimensional identity matrix. Here it is shown why a group is useful for reducing the size of the optimization problem and derive sufficient conditions for the group to satisfy.

The idea for further group reduction comes from inherent symmetries in the lattice and the sublattice. The objective is to partition the discrete Voronoi set and the edge set into subsets of equal size with certain distance properties. More specifically, for any subset of lattice points $\{\lambda_i, i=1, 2, \ldots, M\}$ in this partition and any subset of edges $\{e_i, i=1, 2, \ldots, M\}$ in the partition the set of distances $D_i=\{d_s(\lambda_i, e_j), j=1,2, \ldots, M\}$ should be independent of i. Such sets of points and edges can be obtained by identifying a group of transformations $\sigma=\{\gamma_k, k=1,2 \ldots, M\}$ and then identifying the members of the partition as orbits under the action of this group. The group should have the following properties.

1. Γ must have order 2 or greater.
2. Γ is an orthogonal group.
3. Γ preserves the lattice Λ.
4. Γ acts fixed-point free on $\tilde{\varepsilon}^L$, i.e., for any $\lambda \in \Gamma$, λ not the identity, $\lambda x=x \Rightarrow x=0$.
5. The order of the group divides the g.c.d. of all the shell sizes.
6. Γ preserves the sublattice.

Item 1 ensures that the group contains $1_L$ and $-1_L$. Item 2 ensures that orbits of the group lie entirely within a shell of the lattice. Item 3 is obvious, for otherwise orbits would contain points other than lattice points. Item 4 ensures that all orbits are of equal size. Item 5 ensues that each shell is partitioned into an integral number of orbits. Item 6 is similar to Item 3.

Items 3 and 6 will now be examined more closely. Every lattice point λ can be written in terms of the generator matrix G (columns are basis vectors) and an integer vector u as $\lambda=Gu$. By requiring $\gamma_i Gu=G\gamma_j u$ for some $\gamma_j \in \Gamma$, we ensure that the lattice is preserved. Similarly, if the sublattice has generator $c\tilde{G}G$, where c is a scalar, then by requiring $\gamma_i \tilde{G}=\tilde{G}\gamma_j$, for some $\gamma_j \in \Gamma$, the sublattice will also be preserved. In other words we require that Γ normalizes G and $\tilde{G}$.

Group Construction and Generator Matrices

For $Z^2$, N is chosen to be odd and of the form $N=a^2+b^2$, $a, b \in ZZ$. The generator matrices are $G=I_2$, and $G'=\tilde{G}G$, with $$\tilde{G} = \begin{pmatrix} a & -b \\ b & a \end{pmatrix}. \tag{26}$$

The group is obtained from $\tilde{G}$ and is given by $$\Gamma = \left\{ \pm I_2, \pm \begin{pmatrix} 0 & -1 \\ 1 & 0 \end{pmatrix} \right\}. \tag{27}$$

This group has order 4.

For $Z^4$, N is chosen to be odd and a perfect square. Let $N=a^2+b^2+c^2+d^2$, $a, b, c, d \in ZZ$ (any integer can be written this way). The generator matrices are $I_4$ and $G'=\tilde{G}G$, with $$\tilde{G} = \begin{pmatrix} a & -b & -c & -d \\ b & a & -d & c \\ c & d & a & -b \\ d & -c & b & a \end{pmatrix}. \tag{28}$$

The Group $\Gamma$ is $$\Gamma = \left\{ \pm I_4, \pm \begin{pmatrix} 0 & -1 & 0 & 0 \\ 1 & 0 & 0 & 0 \\ 0 & 0 & 0 & 1 \\ 0 & 0 & -1 & 0 \end{pmatrix}, \right. \tag{29}$$

$$\left. \pm \begin{pmatrix} 0 & 0 & -1 & 0 \\ 0 & 0 & 0 & -1 \\ 1 & 0 & 0 & 0 \\ 0 & 1 & 0 & 0 \end{pmatrix}, \pm \begin{pmatrix} 0 & 0 & 0 & -1 \\ 0 & 0 & 1 & 0 \\ 0 & -1 & 0 & 0 \\ 1 & 0 & 0 & 0 \end{pmatrix} \right\}.$$

This group has order 8.

For, $Z^8$, let $$\gamma_1 = \begin{pmatrix} 0 & 1 & 0 & 0 & & & & \\ 0 & 0 & 1 & 0 & & & & \\ 0 & 0 & 0 & 1 & & & & \\ -1 & 0 & 0 & 0 & & & & \\ & & & & 0 & 1 & 0 & 0 \\ & & & & 0 & 0 & 1 & 0 \\ & & & & 0 & 0 & 0 & 1 \\ & & & & -1 & 0 & 0 & 0 \end{pmatrix} \tag{30}$$

and $$\gamma_8 = \begin{pmatrix} & & & & 1 & 0 & 0 & 0 \\ & & & & 0 & 0 & 0 & -1 \\ & & & & 0 & 0 & -1 & 0 \\ & & & & 0 & -1 & 0 & 0 \\ -1 & 0 & 0 & 0 & & & & \\ 0 & 0 & 0 & 1 & & & & \\ 0 & 0 & 1 & 0 & & & & \\ 0 & 1 & 0 & 0 & & & & \end{pmatrix} \tag{31}$$

Then $\Gamma = \{I_8, \gamma_1^i, \gamma_8, \gamma_1^i, i=1,2,\ldots,7\}$. The generators are $G=I_8$ and $\tilde{G}$ whose ith column is given by $\gamma_i v$, with $v=(a0b0c0d0)'$, where $a, b, c, d$ are chosen to satisfy $N=a^2+b^2+c^2+d^2$, N the index of the sublattice.

Figure 22:
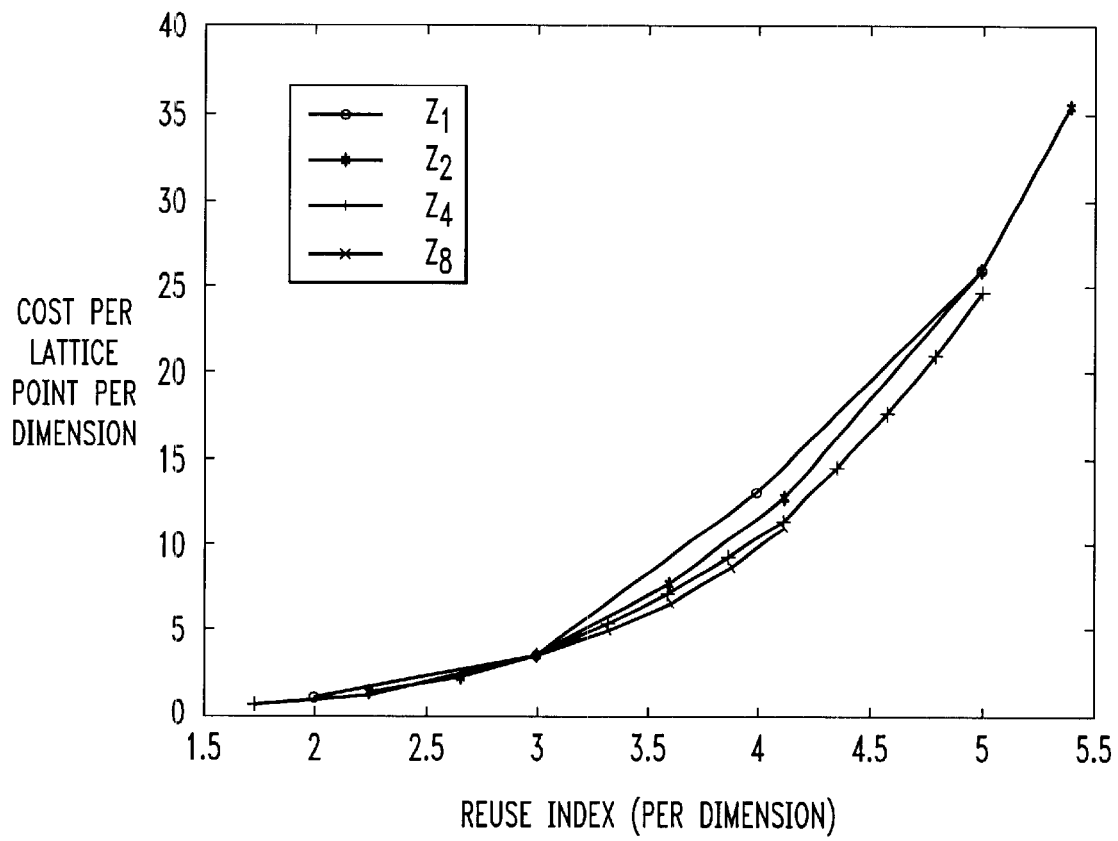
FIG. 22 displays a plot of reuse index versus cost per lattice point per dimension, according to an embodiment of the present invention.

Numerical computations for the lattices $Z^i$, $i=1, 2, 4, 8$ are presented in FIG. 22. In this figure, $\Lambda$ has unit scale and the excess distortion term $(1/N) \Sigma_{\lambda \in V_0(0)} d_s(\lambda)$ has been plotted against the per-dimension reuse index $N^{1/L}$.

Upper and lower bounds for $\bar{d}_s$ as given by (13) are now calculated. The regularity of the labeling function and the high rate assumption lead to the following simplification for the expression $\bar{d}_s$ in (13):

$$\bar{d}_s = \bar{d}_0 + \frac{1}{N} \sum_{\lambda \in V_0(0)} d_s(e). \tag{32}$$

Figure 23:
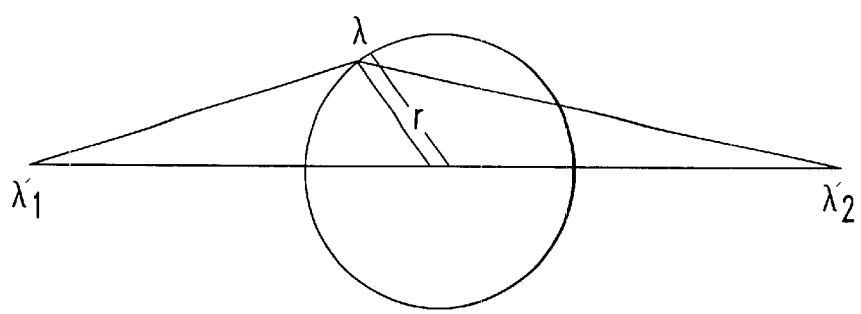
FIG. 23 displays a lattice point λ and its label.

Thus, to analyze the distortion $\bar{d}_s$, only the edges that label points in the discrete Voronoi set $V_0(0)$ need be considered. The analysis relies on knowing precisely the lengths of these edges (which depends on the labeling function construction). Suppose that $\lambda$ is labeled by $e=(\lambda'_1, \lambda'_2)$ as illustrated in FIG. 23. Let $l(e)$ denote the length of the edge $e=(\lambda'_1, \lambda'_2)$, i.e., $l(e)=\|\lambda'_1-\lambda'_2\|$ and let r be the distance of the point $\lambda$ from the midpoint $(\lambda'_1+\lambda'_2)/2$. Then $$2d_s(e) = \|\lambda-\lambda'_1\|^2 + \|\lambda-\lambda'_2\|^2 = (1/2)l(e)^2 + 2r^2. \tag{33}$$

A simple lower bound for $d_s(e)$ is obtained by setting r to zero in the above equation and an upper bound is obtained by replacing r with $r^*(\Lambda')=2R(\Lambda')$, where $R(\Lambda')$ is the covering radius of the sublattice. The upper bound is an application of the triangle inequality. Thus, $$(1/4)l^2(e) \leq d_s(e) \leq (1/4)l^2(e) + r^*(\Lambda')^2, \tag{34}$$

which, by using (32) leads to the bounds $$\bar{d}_0 + \frac{1}{4N} \sum_{\lambda \in V_0(0)} l^2(e) \leq \bar{d}_s \leq \bar{d}_0 + \bar{d}_0 + \frac{1}{4N} \sum_{\lambda \in V_0(0)} l^2(e) + r*(\Lambda')^2. \tag{35}$$

Asymptotic Performance

To carry out a rate-distortion analysis, $\Lambda$ and $\Lambda'$ are scaled by a real number $\beta$. $v(\beta\Lambda)$ is used to denote the volume of a fundamental region of the scaled lattice $\beta\Lambda$. Clearly $v(\beta\Lambda)=\beta^L v(\Lambda)$. For convenience, v will by used as short hand for $v(\Lambda)$. Upon rewriting (14) for the scaled lattice, the following is obtained:

$$R_0 = h(p) - (1/L)\log_2(v(\beta\Lambda)) \tag{36}$$

$$= h(p) - (1/L)\log_2(\beta^L v).$$

Similarly, an expression for R is obtained by rewriting (15) to get $$R = h(p) - (1/L)\log_2(Nv(\beta\Lambda)) \tag{37}$$

$$= h(p) - (1/L)\log_2(N\beta^L v).$$

From (10), the two-channel distortion with the scaled lattice $\beta\Lambda$ is given by $$\bar{d}_0 = G(\Lambda)v^{2/L}\beta^2, \tag{38}$$

since $G(\Lambda)=G(\beta\Lambda)$.

In terms of $R_0$, the two-channel distortion $\bar{d}_0$ is thus given by $$\bar{d}_0 = G(\Lambda)2^{2h(p)} 2^{-2R_0}. \tag{39}$$

Now let N=$2^{L(aR+1)}$. Then $R_0=R(1+a)+1$ and $$\bar{d}_0 = \frac{G(\Lambda)2^{2h(p)}}{4} 2^{-2R(1+a)}. \tag{40}$$

For a given N and R, the correct scale factor is obtained by solving (38) for β:

$$\beta^L = \frac{2^{Lh(p)}2^{-LR(1+a)}}{2^L v}. \tag{41}$$

Consider $\tilde{d}$ defined as $$\tilde{d} = \frac{1}{4N} \sum_{\lambda \in V_0(0)} l^2(e)\beta^2, \tag{42}$$

which is the common term in the bounds for $\bar{d}_s$ given in (35). The quantity $\beta^2$ arises because the scaled lattices $\beta\Lambda$ and $\beta\Lambda'$ are used. e is the edge that labels λ. The edges in question in (42) (the edges in $\epsilon_\lambda(0)$) have been obtained by choosing the N shortest edges in $\beta\Lambda'$, with one endpoint at 0 and then shifting these edges so that the midpoint is as close to the origin as possible. Thus each $l^2(e)$ is of the form $iN^{2/L}$ for some $i\in\mathbb{Z}\mathbb{Z}$. The term $N^{2/L}$ is a scale factor that comes from the fact that $[\Lambda:\Lambda']=N$. The exponent is divided by L since normalized squared lengths are being used. Let the largest value of $l^2(e)$ in (42) be equal to $KN^{2/L}$ and let $B_i$ be the number of $l^2(e)$'s that are equal to $iN^{2/L}$. Then $$\tilde{d} = \frac{1}{4N} \sum_{i=0}^{K} \frac{\beta^2 i B_i N^{2/L}}{L}. \tag{43}$$

The displayed construction of the set $\epsilon_\lambda(0)$ implies that the $B_i$ can be obtained in terms of the coefficients of the theta series of the lattice $\Lambda$. To be specific, if $\Theta_\Lambda(z)=\Sigma_i A_i z^i$ is the theta series for the lattice $\Lambda$, then we can assert that $B_i=A_i, 0 \leq i \leq K$ $B_k \leq A_k. \tag{44}$ This fact will be used a little later. $A_i$ is the number of lattice points λ with $L\|\lambda\|^2=i$.

Now substitute β from (41) and use the fact that $2^{-2aR}=4/N^{2/L}$, to obtain $$\tilde{d} = \frac{2^{2h(p)}2^{-2R(1-a)}}{v^{2/L}N^{(1+2/L)}L} \sum_{i=0}^{K} iB_i \tag{45}$$

$$= \Xi \sum_{i=0}^{K} iB_i,$$

where $\Xi=2^{2h(p)}2^{-2R(1-a)}/(v^{2/L}N^{(1+2/L)}L)$. The term $\Sigma_{i=0}^{K} iB_i$ can be bounded in terms of the $A_i$'s by $$\sum_{i=0}^{K-1} iA_i \leq \sum_{i=0}^{K} iB_i \leq \sum_{i=0}^{K} iA_i. \tag{46}$$

Upon defining $S(m)=\Sigma_{i=0}^m A_i$ and using Abel's summation formula, the following is obtained:

$$\sum_{i=0}^{m} iA_i = mS(m) - \sum_{n=0}^{m-1} S(n). \tag{47}$$

The term S(n) is the number of lattice points in the first n shells of the lattice $\Lambda$. This is roughly the ratio of the volume of $S_L(n^{1/2})$, a sphere of radius $n^{1/2}$, to v, the volume of the Voronoi cell of $\Lambda$. To be specific if $B_L$ denotes the volume of a sphere of unit radius in $\varepsilon^L$ then the following estimate for S(n) is obtained:

$$S(n) = \frac{B_L n^{L/2}}{v}(1 + o(1)). \tag{48}$$

Upon using (48) in order to estimate S(m), the following is obtained:

$$\sum_{i=0}^{m} iA_i = \left(\frac{mB_L m^{L/2}}{v} - \sum_{n=0}^{m-1} \frac{B_L n^{L/2}}{v}\right)(1 + o(1)) \tag{49}$$

$$= \frac{B_L}{v}\left(n^{L/2+1} - \sum_{n=0}^{m-1} n^{L/2}\right)(1 + o(1))$$

$$= \frac{B_L}{v}\left(m^{(L/2+1)} - \frac{m^{(L/2+1)}}{L/2+1} + o(m^{L/2+1})\right)(1 + o(1))$$

$$= \frac{B_L}{v} \frac{L}{L+2} m^{(L/2+1)}(1 + o(1))$$

On substituting (49) into (45) and observing from (48), that $N=(B_L K^{L/2}/v)(1+o(1))$, the following is obtained:

$$\tilde{d} = \frac{1}{B^{\frac{2/L}{L}}(L+2)} 2^{2h(p)} 2^{-2R(1-a)}(1 + o(1)). \tag{50}$$

But $$B_L = \frac{\pi^{L/2}}{\Gamma(L/2+1)}, \tag{51}$$

and $G(S_L)$, the normalized second moment of a sphere in L dimensions, is given by $$G(S_L) = \frac{1}{(L+2)\pi} \Gamma(L/2+1)^{2/L}. \tag{52}$$

Thus, $B_L$ is given in terms of $G(S_L)$ by $$B^{\frac{2/L}{L}} = \frac{1}{G(S_L)(L+2)}, \tag{53}$$

and from (50) it follows that $$\tilde{d}=G(S_L)2^{2h(p)}2^{-2R(1-a)}(1+o(1)). \tag{54}$$

The other terms in (35) are $\bar{d}_0$ and $r^*(\Lambda')^2$. The term $\bar{d}_0$ decays as $2^{-2R(1+a)}$ and $r^*(\Lambda)^2$ decays like $\beta^2 N^{2/L}$, which in turn decays as $2^{-2R}$. Thus $\lim_{R\to\infty} \bar{d}_s 2^{2R(1-a)}=\lim_{R\to\infty} \bar{d} 2^{2R(1-a)}$ and the following final result is obtained:

$$\lim_{R\to\infty} \bar{d} 2^{2R(1-a)}=G(S_L)2^{2h(p)}. \tag{55}$$

Glossary

The following definitions are used for the purposes of the present invention:

$J_n = \{1, 2, \ldots, n\}$

L: Source vector dimension.

N: Index of the sublattice, i.e., $N=[\lambda:\Lambda']$. Also denotes the reuse index, i.e., the number of elements of the central codebook that share the same channel-one label (equivalently the number of elements of the central codebook that share the same channel-two label)

$\alpha$: Desired labeling function that assigns an ordered pair of sublattice points to every lattice point.

$\alpha_u$: Pre-cursor to the labeling function. Maps every lattice point to an unordered pair of sub-lattice points.

$V_0(\lambda')$: Discrete Voronoi set, the set of all lattice points closer to sublattice point $\lambda'$ than to any other sublattice point.

$\epsilon_u(\lambda')$: Image of $V_0(\lambda')$ under $\alpha_u$.

E: Expectation w.r.t. source distribution.

$p(\cdot)$: Source probability density function.

$<x,y>$: Dimension-normalized inner product $=(1/L)\sum_{i=1}^{L} x_i y_i$.

$\|x\|^2$: Dimension-normalized Euclidean squared norm, $\|x\|^2 = <x,x>$.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims.

What is claimed is:

1. A method for transmitting data using multiple description vector quantization, the method comprising:
   (a) quantizing a source vector at a lattice vector quantizer;
   (b) applying a labeling function to the source vector quantized in (a), the labeling function creating at least a first data stream and a second data stream such that the first data stream includes a first representation of the source vector, and the second data stream includes a second representation of the source vector, the first representation and second representation having equivalent reproduction quality, wherein said applying a labeling function includes associating the quantized source vector with at least a first sublattice point that is itself associated with a first data code word, and a second sublattice point that is itself associated with a second data code word; and
   (c) encoding both the first data stream and the second data stream.

2. The method of claim 1, wherein the first encoded data stream and the second encoded data stream are transmitted.

3. The method of claim 2, wherein the labeling function is created by the following steps:
   (1) creating a discrete Voronoi set of lattice points for a given sublattice point, the discrete Voronoi set of lattice points consisting of a definite number of lattice points;
   (2) creating a plurality of edges for the given sublattice point; and
   (3) matching each lattice point in the discrete Voronoi set with a distinct edge in the plurality of edges.

4. The method of claim 2, wherein the sublattice points are defined by scaling a lattice in the lattice vector quantizer.

5. The method of claim 4, wherein the sublattice points are further defined by rotating the scaled lattice in the lattice vector quantizer.

6. The method of claim 2, wherein said transmitting step includes using an edge graph with a plurality of sections, each section having the form $\{\lambda'_i, \lambda'_j\}$, said transmitting step including the substeps of:
   (i) transmitting, for an occurrence of a first section, $\lambda'_i$ in a first data stream, and $\lambda'_j$ in a second data stream; and
   (ii) transmitting, for an occurrence of a second section adjacent to the first section, $\lambda'_j$ in the first data stream, and $\lambda'_i$ in the second data stream.

7. A method for making a labeling function, the method comprising:
   (a) creating a discrete Voronoi set of lattice points for a given sublattice point, the discrete Voronoi set of lattice points consisting of a definite number of lattice points;
   (b) creating a plurality of edges for the given sublattice point, wherein the edges are chosen by determining a plurality of edges having a number of edges, the number of edges being equal to the definite number of lattice points in the discrete Voronoi set; and
   (c) matching each lattice point in the discrete Voronoi set with a distinct edge in the plurality of edges.

8. A method for encoding data using multiple-description-vector quantization, the method comprising:
   (a) associating a lattice point with at least a first sublattice point and a second sublattice point, the lattice point being associated with a quantized source vector;
   (b) producing a first data code word associated with the first sublattice point and a second data code word associated with the second sublattice point; and
   (c) transmitting, in a first data stream, the first associated data code word, and in a second data stream, the second associated data code word.

9. The method of claim 8, wherein said transmitting step (c) includes the substeps of:
   (i) creating an edge graph with a plurality of sections, each section having the form $\{\lambda'_i, \lambda'_j\}$;
   (ii) transmitting, for an occurrence of a first section, $\lambda'_i$ in a first data stream, and $\lambda'_j$ in a second data stream; and
   (iii) transmitting, for an occurrence of a second section adjacent to the first section, $\lambda'_j$ in the first data stream, and $\lambda'_i$ in the second data stream.

10. A method for decoding an encoded data stream that has been encoded with multiple-description-vector quantization, the encoded data stream including a first data stream representing a first set of sublattice points and including a second data stream representing a second set of sublattice points, the method comprising:
   (a) retrieving from the first data stream a representation of a first sublattice point from the first set of sublattice points;
   (b) retrieving from the second data stream a representation of a second sublattice point from the second set of sublattice points; and
   (c) determining a single data code word, the single data code word being associated with the retrieved representation of the first sublattice point and associated with the retrieved representation of the second sublattice point.

11. An apparatus for transmitting a plurality of data streams using multiple description vector quantization, the apparatus comprising:
   (a) a processor; and
   (b) a memory storing instructions adapted to be executed by said processor, the instructions including:

(i) quantizing a source vector at a lattice vector quantizer;

(ii) applying a labeling function to the source vector quantized in (i), the labeling function creating at least a first data stream and a second data stream, the first data stream including a first representation of the source vector, and the second data stream including a second representation of the source vector, the first representation and the second representation having equivalent reproduction quality, wherein said applying a labeling function includes associating the quantized source vector with at least a first sublattice point associated with a first data code word and a second sublattice point associated with a second data code word; and (iii) encoding both the first data stream and the second data stream.

12. The apparatus of claim 11, wherein the first encoded data stream and the second encoded data stream are transmitted.

13. The apparatus of claim 12, wherein the sublattice points are defined by scaling a lattice in the lattice vector quantizer.

14. The apparatus of claim 13, wherein the sublattice points are further defined by rotating the scaled lattice in the lattice vector quantizer.

15. The apparatus of claim 12, wherein said transmitting step includes using an edge graph with a plurality of sections, each section having the form $\{\lambda'_i, \lambda'_j\}$, said transmitting step including the substeps of:

(i) transmitting, for an occurrence of a first section, $\lambda'_i$ in a first data stream, and $\lambda'_j$ in a second data stream; and (ii) transmitting, for an occurrence of a second section adjacent to the first section, $\lambda'_j$ in the first data stream, and $\lambda'_i$ in the second data stream.

16. An apparatus for making a labeling function, the apparatus comprising:

(a) a processor; and (b) a memory storing finctions adapted to be executed by said processor, the instructions including:

(i) creating a discrete Voronoi set of lattice points for a given sublattice point, the discrete Voronoi set of lattice points consisting of a definite number of lattice points;

(ii) creating a plurality of edges for the given sublattice point, wherein the edges are chosen by determining a plurality of edges having a number of edges, the number of edges being equal to the definite number of lattice points in the discrete Voronoi set; and (iii) matching each lattice point in the discrete Voronoi set with a distinct edge in the plurality of edges.

17. An apparatus for encoding data using multiple-description-vector quantization, the apparatus comprising:

(a) a processor; and (b) a memory storing instructions adapted to be executed by said processor, the instructions including:

(i) associating a lattice point with at least a first sublattice point and a second sublattice point, the lattice point being associated with a quantized source vector;

(ii) producing a first data code word associated with the first sublattice point and a second data code word associated with the second sublattice point; and (iii) transmitting, in a first data stream, the first associated data code word, and in a second data stream, the second associated data code word.

18. An apparatus for decoding an encoded data stream that has been encoded with multiple-description-vector quantization, the encoded data stream including a first data stream representing a first set of sublattice points and including a second data stream representing a second set of sublattice points, the apparatus comprising:

(a) a processor; and (b) a memory storing instructions to be executed by said processor, said instructions including:

(i) retrieving from the first data stream a representation of a first sublattice point from the first set of sublattice points;

(ii) retrieving from the second data stream a representation of a second sublattice point from the second set of sublattice points; and (iii) determining a single data code word, the single data code word being associated with the retrieved representation of the first sublattice point and associated with the retrieved representation of the second sublattice point.

* * * * *